(12) United States Patent
Chen et al.

(10) Patent No.: US 12,022,218 B2
(45) Date of Patent: Jun. 25, 2024

(54) DIGITAL IMAGE SENSOR USING A SINGLE-INPUT COMPARATOR BASED QUANTIZER

(71) Applicant: META PLATFORMS TECHNOLOGIES, LLC, Menlo Park, CA (US)

(72) Inventors: Song Chen, Redmond, WA (US); Xinqiao Liu, Medina, WA (US); Tsung-Hsun Tsai, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 240 days.

(21) Appl. No.: 17/554,896

(22) Filed: Dec. 17, 2021

(65) Prior Publication Data
US 2022/0210360 A1    Jun. 30, 2022

Related U.S. Application Data

(60) Provisional application No. 63/131,563, filed on Dec. 29, 2020.

(51) Int. Cl.
*H04N 25/75*      (2023.01)
*G06F 3/14*       (2006.01)
*H04N 25/771*     (2023.01)

(52) U.S. Cl.
CPC ............ *H04N 25/75* (2023.01); *G06F 3/14* (2013.01); *H04N 25/771* (2023.01)

(58) Field of Classification Search
CPC ...... H04N 25/75; H04N 25/78; H04N 25/771; H04N 25/772; H04N 25/778;
(Continued)

(56) References Cited

U.S. PATENT DOCUMENTS 4,596,977 A    6/1986    Bauman et al.
5,053,771 A    10/1991   McDermott
(Continued)

FOREIGN PATENT DOCUMENTS

CN    1490878 A    4/2004
CN    1728397 A    2/2006
(Continued)

OTHER PUBLICATIONS

Advisory Action dated Apr. 7, 2020 for U.S. Appl. No. 15/801,216, filed Nov. 1, 2019, 3 Pages.
(Continued)

*Primary Examiner* — John W Miller
*Assistant Examiner* — Sean N. Haiem
(74) *Attorney, Agent, or Firm* — Kilpatrick Townsend & Stockton LLP

(57) ABSTRACT

One example described herein includes the digital image sensor having a pixel cell with a photodiode and a quantizer circuit coupled to the pixel cell. The quantizer circuit includes a charge storage device that generates a voltage based on electric charge from the photodiode. The quantizer circuit also includes a single-input comparator that can switch from a first output state to a second output state in response to a ramp signal provided by a ramp generator. The quantizer circuit further includes a memory switch that can cause a counter value from a digital counter to be stored in a digital memory in response to the single-input comparator switching from the first output state to the second output state. The counter value can serve as a digital pixel value associated with the pixel cell.

20 Claims, 15 Drawing Sheets

(58) Field of Classification Search
CPC .......... H04N 25/779; G06F 3/14; H03M 1/56; H03M 1/123; H03M 1/0607
USPC ........................................................ 348/143
See application file for complete search history.

(56) References Cited

U.S. PATENT DOCUMENTS

| | | | |
|---|---|---|---|
| 5,650,643 A | 7/1997 | Konuma | |
| 5,844,512 A | 12/1998 | Gorin et al. | |
| 5,963,369 A | 10/1999 | Steinthal et al. | |
| 6,181,822 B1 | 1/2001 | Miller et al. | |
| 6,384,905 B1 | 5/2002 | Barrows | |
| 6,522,395 B1 | 2/2003 | Bamji et al. | |
| 6,529,241 B1 | 3/2003 | Clark | |
| 6,864,817 B1 | 3/2005 | Salvi et al. | |
| 6,963,369 B1 | 11/2005 | Olding | |
| 7,326,903 B2 | 2/2008 | Ackland | |
| 7,362,365 B1 | 4/2008 | Reyneri et al. | |
| 7,659,772 B2 | 2/2010 | Nomura et al. | |
| 7,659,925 B2 | 2/2010 | Krymski | |
| 7,719,589 B2 | 5/2010 | Turchetta et al. | |
| 7,880,779 B2 | 2/2011 | Storm | |
| 7,956,914 B2 | 6/2011 | Xu | |
| 8,134,623 B2 | 3/2012 | Purcell et al. | |
| 8,144,227 B2 | 3/2012 | Kobayashi | |
| 8,369,458 B2 | 2/2013 | Wong et al. | |
| 8,426,793 B1 | 4/2013 | Barrows | |
| 8,754,798 B2 | 6/2014 | Lin | |
| 8,773,562 B1 | 7/2014 | Fan | |
| 8,779,346 B2 | 7/2014 | Fowler et al. | |
| 8,946,610 B2 | 2/2015 | Iwabuchi et al. | |
| 9,001,251 B2 | 4/2015 | Smith et al. | |
| 9,094,629 B2 | 7/2015 | Ishibashi | |
| 9,185,273 B2 | 11/2015 | Beck et al. | |
| 9,274,151 B2 | 3/2016 | Lee et al. | |
| 9,282,264 B2 | 3/2016 | Park et al. | |
| 9,332,200 B1 | 5/2016 | Hseih et al. | |
| 9,343,497 B2 | 5/2016 | Cho | |
| 9,363,454 B2 | 6/2016 | Ito et al. | |
| 9,478,579 B2 | 10/2016 | Dai et al. | |
| 9,497,396 B2 | 11/2016 | Choi | |
| 9,531,990 B1 | 12/2016 | Wilkins et al. | |
| 9,800,260 B1 | 10/2017 | Banerjee | |
| 9,819,885 B2 | 11/2017 | Furukawa et al. | |
| 9,832,370 B2 | 11/2017 | Cho et al. | |
| 9,909,922 B2 | 3/2018 | Schweickert et al. | |
| 9,948,316 B1 | 4/2018 | Yun et al. | |
| 9,955,091 B1 | 4/2018 | Dai et al. | |
| 9,967,496 B2 | 5/2018 | Ayers et al. | |
| 10,003,759 B2 | 6/2018 | Fan | |
| 10,015,416 B2 | 7/2018 | Borthakur et al. | |
| 10,090,342 B1 | 10/2018 | Gambino et al. | |
| 10,096,631 B2 | 10/2018 | Ishizu | |
| 10,154,221 B2 | 12/2018 | Ogino et al. | |
| 10,157,951 B2 | 12/2018 | Kim et al. | |
| 10,321,081 B2 | 6/2019 | Watanabe et al. | |
| 10,345,447 B1 | 7/2019 | Hicks | |
| 10,419,701 B2 | 9/2019 | Liu | |
| 10,574,925 B2 | 2/2020 | Otaka | |
| 10,594,974 B2 | 3/2020 | Ivarsson et al. | |
| 10,598,546 B2 | 3/2020 | Liu | |
| 10,608,101 B2 | 3/2020 | Liu | |
| 10,686,996 B2 | 6/2020 | Liu | |
| 10,726,627 B2 | 7/2020 | Liu | |
| 10,750,097 B2 | 8/2020 | Liu | |
| 10,764,526 B1 | 9/2020 | Liu et al. | |
| 10,804,926 B2 | 10/2020 | Gao et al. | |
| 10,812,742 B2 | 10/2020 | Chen et al. | |
| 10,825,854 B2 | 11/2020 | Liu | |
| 10,834,344 B2 | 11/2020 | Chen et al. | |
| 10,897,586 B2 | 1/2021 | Liu et al. | |
| 10,903,260 B2 | 1/2021 | Chen et al. | |
| 10,917,589 B2 | 2/2021 | Liu | |
| 10,951,849 B2 | 3/2021 | Liu | |
| 10,969,273 B2 | 4/2021 | Berkovich et al. | |
| 11,004,881 B2 | 5/2021 | Liu et al. | |
| 11,057,581 B2 | 7/2021 | Liu | |
| 11,089,210 B2 | 8/2021 | Berkovich et al. | |
| 11,595,598 B2 | 2/2023 | Liu et al. | |
| 11,595,602 B2 | 2/2023 | Gao et al. | |
| 11,729,525 B2 | 8/2023 | Liu | |
| 2002/0067303 A1 | 6/2002 | Lee et al. | |
| 2002/0113886 A1 | 8/2002 | Hynecek | |
| 2002/0118289 A1* | 8/2002 | Choi | H04N 25/76 348/E5.079 |
| 2003/0001080 A1 | 1/2003 | Kummaraguntla et al. | |
| 2003/0020100 A1 | 1/2003 | Guidash | |
| 2003/0049925 A1 | 3/2003 | Layman et al. | |
| 2004/0090200 A1* | 5/2004 | Youm | H02P 1/022 318/434 |
| 2004/0095495 A1 | 5/2004 | Inokuma et al. | |
| 2004/0118994 A1 | 6/2004 | Mizuno | |
| 2004/0227495 A1* | 11/2004 | Egan | G05F 1/618 323/272 |
| 2004/0251483 A1 | 12/2004 | Ko et al. | |
| 2005/0046715 A1 | 3/2005 | Lim et al. | |
| 2005/0057389 A1 | 3/2005 | Krymski | |
| 2005/0104983 A1 | 5/2005 | Raynor | |
| 2005/0206414 A1 | 9/2005 | Cottin et al. | |
| 2005/0231624 A1* | 10/2005 | Muramatsu | H03M 1/123 348/311 |
| 2005/0237380 A1 | 10/2005 | Kakii et al. | |
| 2005/0280727 A1 | 12/2005 | Sato et al. | |
| 2006/0023109 A1 | 2/2006 | Mabuchi et al. | |
| 2006/0146159 A1 | 7/2006 | Farrier | |
| 2006/0157759 A1 | 7/2006 | Okita et al. | |
| 2006/0158541 A1 | 7/2006 | Ichikawa | |
| 2007/0013983 A1 | 1/2007 | Kitamura et al. | |
| 2007/0076109 A1 | 4/2007 | Krymski | |
| 2007/0076481 A1 | 4/2007 | Tennant | |
| 2007/0092244 A1 | 4/2007 | Pertsel et al. | |
| 2007/0102740 A1 | 5/2007 | Ellis-Monaghan et al. | |
| 2007/0131991 A1 | 6/2007 | Sugawa | |
| 2007/0208526 A1 | 9/2007 | Staudt et al. | |
| 2007/0216564 A1* | 9/2007 | Koseki | H04N 25/75 348/E5.079 |
| 2007/0222881 A1 | 9/2007 | Mentzer | |
| 2008/0001065 A1 | 1/2008 | Ackland | |
| 2008/0007731 A1 | 1/2008 | Botchway et al. | |
| 2008/0042888 A1 | 2/2008 | Danesh | |
| 2008/0068478 A1 | 3/2008 | Watanabe | |
| 2008/0088014 A1 | 4/2008 | Adkisson et al. | |
| 2008/0191791 A1 | 8/2008 | Nomura et al. | |
| 2008/0226170 A1 | 9/2008 | Sonoda | |
| 2008/0226183 A1 | 9/2008 | Lei et al. | |
| 2008/0266434 A1 | 10/2008 | Sugawa et al. | |
| 2009/0002528 A1 | 1/2009 | Manabe et al. | |
| 2009/0033588 A1 | 2/2009 | Kajita et al. | |
| 2009/0040364 A1 | 2/2009 | Rubner | |
| 2009/0091645 A1 | 4/2009 | Trimeche et al. | |
| 2009/0128640 A1 | 5/2009 | Yumiki | |
| 2009/0140305 A1 | 6/2009 | Sugawa | |
| 2009/0219266 A1 | 9/2009 | Lim et al. | |
| 2009/0224139 A1 | 9/2009 | Buettgen et al. | |
| 2009/0237536 A1 | 9/2009 | Purcell et al. | |
| 2009/0244346 A1 | 10/2009 | Funaki | |
| 2009/0245637 A1 | 10/2009 | Barman et al. | |
| 2009/0256735 A1* | 10/2009 | Bogaerts | H03M 1/1019 341/169 |
| 2009/0261235 A1 | 10/2009 | Lahav et al. | |
| 2009/0321615 A1 | 12/2009 | Sugiyama et al. | |
| 2010/0013969 A1 | 1/2010 | Ui | |
| 2010/0140732 A1 | 6/2010 | Eminoglu et al. | |
| 2010/0194956 A1 | 8/2010 | Yuan et al. | |
| 2010/0232227 A1 | 9/2010 | Lee | |
| 2010/0276572 A1 | 11/2010 | Iwabuchi et al. | |
| 2011/0049589 A1 | 3/2011 | Chuang et al. | |
| 2011/0122304 A1 | 5/2011 | Sedelnikov | |
| 2011/0149116 A1 | 6/2011 | Kim | |
| 2011/0155892 A1 | 6/2011 | Neter et al. | |
| 2011/0254986 A1 | 10/2011 | Nishimura et al. | |
| 2012/0016817 A1 | 1/2012 | Smith et al. | |
| 2012/0039548 A1* | 2/2012 | Wang | H04N 25/677 382/312 |

(56) References Cited

U.S. PATENT DOCUMENTS

| | | |
|---|---|---|
| 2012/0068051 A1 | 3/2012 | Ahn et al. |
| 2012/0092677 A1 | 4/2012 | Suehira et al. |
| 2012/0105475 A1 | 5/2012 | Tseng |
| 2012/0105668 A1 | 5/2012 | Velarde et al. |
| 2012/0113119 A1 | 5/2012 | Massie |
| 2012/0127284 A1 | 5/2012 | Bar-Zeev et al. |
| 2012/0133807 A1 | 5/2012 | Wu et al. |
| 2012/0138775 A1 | 6/2012 | Cheon et al. |
| 2012/0153123 A1 | 6/2012 | Mao et al. |
| 2012/0188420 A1 | 7/2012 | Black et al. |
| 2012/0200499 A1 | 8/2012 | Osterhout et al. |
| 2012/0205520 A1 | 8/2012 | Hsieh et al. |
| 2012/0212465 A1 | 8/2012 | White et al. |
| 2012/0241591 A1 | 9/2012 | Wan et al. |
| 2012/0262616 A1 | 10/2012 | Sa et al. |
| 2012/0267511 A1 | 10/2012 | Kozlowski |
| 2012/0273654 A1 | 11/2012 | Hynecek et al. |
| 2012/0305751 A1 | 12/2012 | Kusuda |
| 2013/0020466 A1 | 1/2013 | Ayers et al. |
| 2013/0056809 A1 | 3/2013 | Mao et al. |
| 2013/0057742 A1 | 3/2013 | Nakamura et al. |
| 2013/0068929 A1 | 3/2013 | Solhusvik et al. |
| 2013/0069787 A1 | 3/2013 | Petrou |
| 2013/0082313 A1 | 4/2013 | Manabe |
| 2013/0113969 A1 | 5/2013 | Manabe et al. |
| 2013/0126710 A1 | 5/2013 | Kondo |
| 2013/0141619 A1 | 6/2013 | Lim et al. |
| 2013/0187027 A1 | 7/2013 | Qiao et al. |
| 2013/0207219 A1 | 8/2013 | Ahn |
| 2013/0214127 A1 | 8/2013 | Ohya et al. |
| 2013/0214371 A1 | 8/2013 | Asatsuma et al. |
| 2013/0218728 A1 | 8/2013 | Hashop et al. |
| 2013/0221194 A1 | 8/2013 | Manabe |
| 2013/0229543 A1 | 9/2013 | Hashimoto et al. |
| 2013/0229560 A1 | 9/2013 | Kondo |
| 2013/0234029 A1 | 9/2013 | Bikumandla |
| 2013/0293752 A1 | 11/2013 | Peng et al. |
| 2013/0299674 A1 | 11/2013 | Fowler et al. |
| 2014/0021574 A1 | 1/2014 | Egawa |
| 2014/0042299 A1 | 2/2014 | Wan et al. |
| 2014/0042582 A1 | 2/2014 | Kondo |
| 2014/0070974 A1 | 3/2014 | Park et al. |
| 2014/0078336 A1 | 3/2014 | Beck et al. |
| 2014/0085523 A1 | 3/2014 | Hynecek |
| 2014/0176770 A1 | 6/2014 | Kondo |
| 2014/0211052 A1 | 7/2014 | Choi |
| 2014/0232890 A1 | 8/2014 | Yoo et al. |
| 2014/0247382 A1 | 9/2014 | Moldovan et al. |
| 2014/0306276 A1 | 10/2014 | Yamaguchi |
| 2014/0368687 A1 | 12/2014 | Yu et al. |
| 2015/0070544 A1 | 3/2015 | Smith et al. |
| 2015/0077611 A1 | 3/2015 | Yamashita et al. |
| 2015/0083895 A1 | 3/2015 | Hashimoto et al. |
| 2015/0085134 A1 | 3/2015 | Novotny et al. |
| 2015/0090863 A1 | 4/2015 | Mansoorian et al. |
| 2015/0172574 A1 | 6/2015 | Honda et al. |
| 2015/0179696 A1 | 6/2015 | Kurokawa et al. |
| 2015/0189209 A1 | 7/2015 | Yang et al. |
| 2015/0201142 A1 | 7/2015 | Smith et al. |
| 2015/0208009 A1 | 7/2015 | Oh et al. |
| 2015/0229859 A1 | 8/2015 | Guidash et al. |
| 2015/0237274 A1 | 8/2015 | Yang et al. |
| 2015/0279884 A1 | 10/2015 | Kusumoto |
| 2015/0281613 A1 | 10/2015 | Vogelsang et al. |
| 2015/0287766 A1 | 10/2015 | Kim et al. |
| 2015/0309311 A1 | 10/2015 | Cho |
| 2015/0309316 A1 | 10/2015 | Osterhout et al. |
| 2015/0312461 A1 | 10/2015 | Kim et al. |
| 2015/0312502 A1 | 10/2015 | Borremans |
| 2015/0312557 A1 | 10/2015 | Kim |
| 2015/0350582 A1 | 12/2015 | Korobov et al. |
| 2015/0358569 A1 | 12/2015 | Egawa |
| 2015/0358571 A1 | 12/2015 | Dominguez Castro et al. |
| 2015/0358593 A1 | 12/2015 | Sato |
| 2015/0381907 A1 | 12/2015 | Boettiger et al. |
| 2015/0381911 A1 | 12/2015 | Shen et al. |
| 2016/0011422 A1 | 1/2016 | Thurber et al. |
| 2016/0018645 A1 | 1/2016 | Haddick et al. |
| 2016/0021302 A1 | 1/2016 | Cho et al. |
| 2016/0028974 A1* | 1/2016 | Guidash ............ H04N 25/671 348/294 |
| 2016/0028980 A1 | 1/2016 | Kameyama et al. |
| 2016/0037111 A1 | 2/2016 | Dai et al. |
| 2016/0078614 A1 | 3/2016 | Ryu et al. |
| 2016/0088253 A1 | 3/2016 | Tezuka |
| 2016/0100113 A1 | 4/2016 | Oh et al. |
| 2016/0100115 A1 | 4/2016 | Kusano |
| 2016/0111457 A1 | 4/2016 | Sekine |
| 2016/0112626 A1 | 4/2016 | Shimada |
| 2016/0118992 A1 | 4/2016 | Milkov |
| 2016/0165160 A1 | 6/2016 | Hseih et al. |
| 2016/0197117 A1 | 7/2016 | Nakata et al. |
| 2016/0204150 A1 | 7/2016 | Oh et al. |
| 2016/0210785 A1 | 7/2016 | Balachandreswaran et al. |
| 2016/0240570 A1 | 8/2016 | Barna et al. |
| 2016/0249004 A1 | 8/2016 | Saeki et al. |
| 2016/0255293 A1 | 9/2016 | Gesset |
| 2016/0277010 A1 | 9/2016 | Park et al. |
| 2016/0307945 A1 | 10/2016 | Madurawe |
| 2016/0307949 A1 | 10/2016 | Madurawe |
| 2016/0309140 A1* | 10/2016 | Wang ............... H04N 17/002 |
| 2016/0337605 A1 | 11/2016 | Ito |
| 2016/0353045 A1 | 12/2016 | Kawahito et al. |
| 2016/0360127 A1 | 12/2016 | Dierickx et al. |
| 2017/0013215 A1 | 1/2017 | McCarten |
| 2017/0039906 A1 | 2/2017 | Jepsen |
| 2017/0041571 A1 | 2/2017 | Tyrrell et al. |
| 2017/0053962 A1 | 2/2017 | Oh et al. |
| 2017/0059399 A1 | 3/2017 | Suh et al. |
| 2017/0062501 A1 | 3/2017 | Velichko et al. |
| 2017/0069363 A1 | 3/2017 | Baker |
| 2017/0070691 A1 | 3/2017 | Nishikido |
| 2017/0099422 A1 | 4/2017 | Goma et al. |
| 2017/0099446 A1 | 4/2017 | Cremers et al. |
| 2017/0104021 A1 | 4/2017 | Park et al. |
| 2017/0104946 A1 | 4/2017 | Hong |
| 2017/0111600 A1 | 4/2017 | Wang et al. |
| 2017/0141147 A1 | 5/2017 | Raynor |
| 2017/0154909 A1 | 6/2017 | Ishizu |
| 2017/0170223 A1 | 6/2017 | Hynecek et al. |
| 2017/0195602 A1 | 7/2017 | Iwabuchi et al. |
| 2017/0201693 A1 | 7/2017 | Sugizaki et al. |
| 2017/0207268 A1 | 7/2017 | Kurokawa |
| 2017/0228345 A1 | 8/2017 | Gupta et al. |
| 2017/0251151 A1 | 8/2017 | Hicks |
| 2017/0270664 A1 | 9/2017 | Hoogi et al. |
| 2017/0272667 A1 | 9/2017 | Hynecek |
| 2017/0272768 A1 | 9/2017 | Tall et al. |
| 2017/0280031 A1 | 9/2017 | Price et al. |
| 2017/0293799 A1 | 10/2017 | Skogo et al. |
| 2017/0310910 A1 | 10/2017 | Smith et al. |
| 2017/0318250 A1 | 11/2017 | Sakakibara et al. |
| 2017/0324917 A1 | 11/2017 | Mlinar et al. |
| 2017/0338262 A1 | 11/2017 | Hirata |
| 2017/0339327 A1 | 11/2017 | Koshkin et al. |
| 2017/0346579 A1 | 11/2017 | Barghi |
| 2017/0350755 A1 | 12/2017 | Geurts |
| 2017/0359497 A1 | 12/2017 | Mandelli et al. |
| 2017/0359521 A1* | 12/2017 | Kim ............... H04N 25/772 |
| 2017/0366766 A1 | 12/2017 | Geurts et al. |
| 2018/0019269 A1 | 1/2018 | Klipstein |
| 2018/0077368 A1 | 3/2018 | Suzuki |
| 2018/0115725 A1 | 4/2018 | Zhang et al. |
| 2018/0136471 A1 | 5/2018 | Miller et al. |
| 2018/0143701 A1 | 5/2018 | Suh et al. |
| 2018/0152650 A1 | 5/2018 | Sakakibara et al. |
| 2018/0167575 A1 | 6/2018 | Watanabe et al. |
| 2018/0175083 A1 | 6/2018 | Takahashi |
| 2018/0176545 A1 | 6/2018 | Aflaki Beni |
| 2018/0204867 A1 | 7/2018 | Kim et al. |
| 2018/0220093 A1 | 8/2018 | Murao et al. |
| 2018/0224658 A1 | 8/2018 | Teller |
| 2018/0227516 A1 | 8/2018 | Mo et al. |
| 2018/0241953 A1 | 8/2018 | Johnson |

(56) References Cited

U.S. PATENT DOCUMENTS

| | | |
|---|---|---|
| 2018/0270436 A1 | 9/2018 | Ivarsson et al. |
| 2018/0276841 A1 | 9/2018 | Krishnaswamy et al. |
| 2018/0376046 A1 | 12/2018 | Liu |
| 2018/0376090 A1* | 12/2018 | Liu ............... H04N 25/75 |
| 2019/0035154 A1 | 1/2019 | Liu |
| 2019/0046044 A1 | 2/2019 | Tzvieli et al. |
| 2019/0052788 A1 | 2/2019 | Liu |
| 2019/0052821 A1 | 2/2019 | Berner et al. |
| 2019/0056264 A1 | 2/2019 | Liu |
| 2019/0057995 A1 | 2/2019 | Liu |
| 2019/0058058 A1 | 2/2019 | Liu |
| 2019/0098232 A1 | 3/2019 | Mori et al. |
| 2019/0104263 A1 | 4/2019 | Ochiai et al. |
| 2019/0104265 A1 | 4/2019 | Totsuka et al. |
| 2019/0110039 A1 | 4/2019 | Linde et al. |
| 2019/0115931 A1* | 4/2019 | Hurwitz ............ H03M 1/56 |
| 2019/0123088 A1 | 4/2019 | Kwon |
| 2019/0124285 A1* | 4/2019 | Otaka ............ H04N 25/772 |
| 2019/0141270 A1 | 5/2019 | Otaka et al. |
| 2019/0149751 A1 | 5/2019 | Wise |
| 2019/0157330 A1 | 5/2019 | Sato et al. |
| 2019/0172227 A1 | 6/2019 | Kasahara |
| 2019/0172868 A1 | 6/2019 | Chen et al. |
| 2019/0191116 A1 | 6/2019 | Madurawe |
| 2019/0246036 A1 | 8/2019 | Wu et al. |
| 2019/0253650 A1 | 8/2019 | Kim |
| 2019/0327439 A1 | 10/2019 | Chen et al. |
| 2019/0331914 A1 | 10/2019 | Lee et al. |
| 2019/0335151 A1 | 10/2019 | Rivard et al. |
| 2019/0348460 A1 | 11/2019 | Chen et al. |
| 2019/0355782 A1 | 11/2019 | Do et al. |
| 2019/0363118 A1 | 11/2019 | Berkovich et al. |
| 2019/0371845 A1 | 12/2019 | Chen et al. |
| 2019/0376845 A1 | 12/2019 | Liu et al. |
| 2019/0379388 A1 | 12/2019 | Gao et al. |
| 2019/0379827 A1 | 12/2019 | Berkovich et al. |
| 2019/0379846 A1 | 12/2019 | Chen et al. |
| 2020/0007800 A1 | 1/2020 | Berkovich et al. |
| 2020/0053299 A1 | 2/2020 | Zhang et al. |
| 2020/0059589 A1 | 2/2020 | Liu et al. |
| 2020/0068189 A1 | 2/2020 | Chen et al. |
| 2020/0186731 A1 | 6/2020 | Chen et al. |
| 2020/0195875 A1 | 6/2020 | Berkovich et al. |
| 2020/0217714 A1 | 7/2020 | Liu |
| 2020/0228745 A1 | 7/2020 | Otaka |
| 2020/0374475 A1 | 11/2020 | Fukuoka et al. |
| 2021/0026796 A1 | 1/2021 | Graif et al. |
| 2021/0099659 A1 | 4/2021 | Miyauchi et al. |
| 2021/0185264 A1 | 6/2021 | Wong et al. |
| 2021/0227159 A1 | 7/2021 | Sambonsugi |
| 2021/0368124 A1 | 11/2021 | Berkovich et al. |
| 2023/0080288 A1 | 3/2023 | Berkovich et al. |
| 2023/0092325 A1 | 3/2023 | Tsai et al. |
| 2023/0239582 A1 | 7/2023 | Berkovich et al. |

FOREIGN PATENT DOCUMENTS

| | | |
|---|---|---|
| CN | 1812506 A | 8/2006 |
| CN | 101753866 A | 6/2010 |
| CN | 103002228 A | 3/2013 |
| CN | 103207716 A | 7/2013 |
| CN | 104125418 A | 10/2014 |
| CN | 104204904 A | 12/2014 |
| CN | 104469195 A | 3/2015 |
| CN | 104704812 A | 6/2015 |
| CN | 104733485 A | 6/2015 |
| CN | 104754255 A | 7/2015 |
| CN | 204633945 U | 9/2015 |
| CN | 105144699 A | 12/2015 |
| CN | 105529342 A | 4/2016 |
| CN | 105706439 A | 6/2016 |
| CN | 205666884 U | 10/2016 |
| CN | 106255978 A | 12/2016 |
| CN | 106791504 A | 5/2017 |
| CN | 107852473 A | 3/2018 |
| CN | ZL201810821296 | 6/2022 |
| DE | 202016105510 U1 | 10/2016 |
| EP | 0675345 A2 | 10/1995 |
| EP | 1681856 A2 | 7/2006 |
| EP | 1732134 A1 | 12/2006 |
| EP | 1746820 A1 | 1/2007 |
| EP | 1788802 A1 | 5/2007 |
| EP | 2037505 A1 | 3/2009 |
| EP | 2063630 A1 | 5/2009 |
| EP | 2538664 A2 | 12/2012 |
| EP | 2804074 A2 | 11/2014 |
| EP | 2833619 A1 | 2/2015 |
| EP | 3032822 A1 | 6/2016 |
| EP | 3229457 A1 | 10/2017 |
| EP | 3258683 A1 | 12/2017 |
| EP | 3425352 A1 | 1/2019 |
| EP | 3439039 A1 | 2/2019 |
| EP | 3744085 A2 | 12/2020 |
| JP | H08195906 A | 7/1996 |
| JP | 2001088101 A | 1/2001 |
| JP | 2002199292 A | 7/2002 |
| JP | 2003319262 A | 11/2003 |
| JP | 2005328493 A | 11/2005 |
| JP | 2006197382 A | 7/2006 |
| JP | 2006203736 A | 8/2006 |
| JP | 2007074447 A | 3/2007 |
| JP | 2011216966 A | 10/2011 |
| JP | 2012054495 A | 3/2012 |
| JP | 2012054876 A | 3/2012 |
| JP | 2012095349 A | 5/2012 |
| JP | 2013009087 A | 1/2013 |
| JP | 2013055581 A | 3/2013 |
| JP | 2013172203 A | 9/2013 |
| JP | 2013225774 A | 10/2013 |
| JP | 2014107596 A | 6/2014 |
| JP | 2014165733 A | 9/2014 |
| JP | 2014236183 A | 12/2014 |
| JP | 2015065524 A | 4/2015 |
| JP | 2015126043 A | 7/2015 |
| JP | 2015530855 A | 10/2015 |
| JP | 2015211259 A | 11/2015 |
| JP | 2016092661 A | 5/2016 |
| JP | 2016513942 A | 5/2016 |
| JP | 2017509251 A | 3/2017 |
| KR | 100574959 B1 | 4/2006 |
| KR | 20080019652 A | 3/2008 |
| KR | 20090023549 A | 3/2009 |
| KR | 20110050351 A | 5/2011 |
| KR | 20110134941 A | 12/2011 |
| KR | 20120058337 A | 6/2012 |
| KR | 20120117953 A | 10/2012 |
| KR | 20150095841 A | 8/2015 |
| KR | 20160008267 A | 1/2016 |
| KR | 20160008287 A | 1/2016 |
| TW | 201448184 A | 12/2014 |
| TW | 201719874 A | 6/2017 |
| TW | 201728161 A | 8/2017 |
| TW | I624694 B | 5/2018 |
| WO | WO-2006124592 A2 | 11/2006 |
| WO | WO-2006129762 A1 | 12/2006 |
| WO | WO-2010117462 A1 | 10/2010 |
| WO | WO-2013099723 A1 | 7/2013 |
| WO | WO-2014055391 A2 | 4/2014 |
| WO | 2014144391 A1 | 9/2014 |
| WO | WO-2015135836 A1 | 9/2015 |
| WO | 2015182390 A1 | 12/2015 |
| WO | 2016014860 A1 | 1/2016 |
| WO | WO-2016095057 A1 | 6/2016 |
| WO | 2016194653 A1 | 12/2016 |
| WO | WO-2017003477 A1 | 1/2017 |
| WO | WO-2017013806 A1 | 1/2017 |
| WO | WO-2017047010 A1 | 3/2017 |
| WO | WO-2017058488 A1 | 4/2017 |
| WO | WO-2017069706 A1 | 4/2017 |
| WO | WO-2017169446 A1 | 10/2017 |
| WO | WO-2017169882 A1 | 10/2017 |
| WO | WO-2019018084 A1 | 1/2019 |

(56) References Cited

FOREIGN PATENT DOCUMENTS

| WO | WO-2019111528 A1 | 6/2019 |
|---|---|---|
| WO | WO-2019145578 A1 | 8/2019 |
| WO | WO-2019168929 A1 | 9/2019 |

OTHER PUBLICATIONS

Advisory Action dated Oct. 8, 2020 for U.S. Appl. No. 16/210,748, filed Dec. 5, 2018, 4 Pages.
Advisory Action dated Oct. 1, 2021 for U.S. Appl. No. 17/083,920, filed Oct. 29, 2020, 4 pages.
Advisory Action dated Oct. 23, 2019 for U.S. Appl. No. 15/668,241, filed Aug. 3, 2017, 5 Pages.
Amir M.F., et al., "3-D Stacked Image Sensor With Deep Neural Network Computation," IEEE Sensors Journal, IEEE Service Center, New York, NY, US, May 15, 2018, vol. 18 (10), pp. 4187-4199, XP011681876.
Cho K., et al., "A Low Power Dual CDS for a Column-Parallel CMOS Image Sensor," Journal of Semiconductor Technology and Science, Dec. 30, 2012, vol. 12 (4), pp. 388-396.
Chuxi L., et al., "A Memristor-Based Processing-in-Memory Architecture for Deep Convolutional Neural Networks Approximate Computation," Journal of Computer Research and Development, Jun. 30, 2017, vol. 54 (6), pp. 1367-1380.
Communication Pursuant Article 94(3) dated Dec. 23, 2021 for European Application No. 19744961.4, filed Jun. 28, 2019, 8 pages.
Communication Pursuant Article 94(3) dated Jan. 5, 2022 for European Application No. 19740456.9, filed Jun. 27, 2019, 12 pages.
Corrected Notice of Allowability dated Feb. 3, 2021 for U.S. Appl. No. 16/566,583, filed Sep. 10, 2019, 2 Pages.
Corrected Notice of Allowability dated Apr. 9, 2021 for U.S. Appl. No. 16/255,528, filed Jan. 23, 2019, 5 Pages.
Corrected Notice of Allowability dated Dec. 11, 2020 for U.S. Appl. No. 16/566,583, filed Sep. 10, 2019, 2 Pages.
Corrected Notice of Allowability dated Jul. 26, 2021 for U.S. Appl. No. 16/707,988, filed Dec. 9, 2019, 2 Pages.
Corrected Notice of Allowability dated Apr. 28, 2020 for U.S. Appl. No. 15/876,061, filed Jan. 19, 2018, 2 Pages.
Corrected Notice of Allowance dated Mar. 7, 2022 for U.S. Appl. No. 17/150,925, filed Jan. 15, 2021, 2 Pages.
Corrected Notice of Allowance dated Mar. 29, 2022 for U.S. Appl. No. 17/150,925, filed Jan. 15, 2021, 2 Pages.
Extended European Search Report for European Application No. 18179838.0, dated May 24, 2019, 17 Pages.
Extended European Search Report for European Application No. 18179846.3, dated Dec. 7, 2018, 10 Pages.
Extended European Search Report for European Application No. 18179851.3, dated Dec. 7, 2018, 8 Pages.
Extended European Search Report for European Application No. 18188684.7, dated Jan. 16, 2019, 10 Pages.
Extended European Search Report for European Application No. 18188962.7, dated Oct. 23, 2018, 8 Pages.
Extended European Search Report for European Application No. 18188968.4, dated Oct. 23, 2018, 8 Pages.
Extended European Search Report for European Application No. 18189100.3, dated Oct. 9, 2018, 8 Pages.
Extended European Search Report for European Application No. 19743908.6, dated Sep. 30, 2020, 9 Pages.
Final Office Action dated Dec. 3, 2021 for U.S. Appl. No. 17/072,840, filed Oct. 16, 2020, 23 pages.
Final Office Action dated Jul. 7, 2020 for U.S. Appl. No. 16/210,748, filed Dec. 5, 2018, 11 Pages.
Final Office Action dated Jul. 12, 2021 for U.S. Appl. No. 16/435,451, filed Jun. 7, 2019, 13 Pages.
Final Office Action dated Apr. 15, 2020 for U.S. Appl. No. 16/566,583, filed Sep. 10, 2019, 24 Pages.
Final Office Action dated Jun. 17, 2019 for U.S. Appl. No. 15/668,241, filed Aug. 3, 2017, 19 Pages.
Final Office Action dated Oct. 18, 2021 for U.S. Appl. No. 16/716,050, filed Dec. 16, 2019, 18 Pages.
Final Office Action dated Oct. 21, 2021 for U.S. Appl. No. 16/421,441, filed May 23, 2019, 23 Pages.
Final Office Action dated Dec. 26, 2019 for U.S. Appl. No. 15/801,216, filed Nov. 1, 2017, 5 Pages.
Final Office Action dated Feb. 27, 2020 for U.S. Appl. No. 16/177,971, filed Nov. 1, 2018, 9 Pages.
Final Office Action dated Jan. 27, 2021 for U.S. Appl. No. 16/255,528, filed Jan. 23, 2019, 31 Pages.
Final Office Action dated Jul. 28, 2021 for U.S. Appl. No. 17/083,920, filed Oct. 29, 2020, 19 Pages.
Final Office Action dated Apr. 29, 2020 for U.S. Appl. No. 15/719,345, filed Sep. 28, 2017, 14 Pages.
International Preliminary Report on Patentability for International Application No. PCT/US2018/039350, dated Jan. 9, 2020, 10 Pages.
International Preliminary Report on Patentability for International Application No. PCT/US2020/044807, dated Feb. 17, 2022, 10 pages.
International Search Report and Written Opinion for International Application No. PCT/US2018/039350, dated Nov. 15, 2018, 11 Pages.
International Search Report and Written Opinion for International Application No. PCT/US2018/039352, dated Oct. 26, 2018, 8 Pages.
International Search Report and Written Opinion for International Application No. PCT/US2018/039431, dated Nov. 7, 2018, 12 Pages.
International Search Report and Written Opinion for International Application No. PCT/US2018/045661, dated Nov. 30, 2018, 11 Pages.
International Search Report and Written Opinion for International Application No. PCT/US2018/045666, dated Dec. 3, 2018, 13 Pages.
International Search Report and Written Opinion for International Application No. PCT/US2018/045673, dated Dec. 4, 2018, 13 Pages.
International Search Report and Written Opinion for International Application No. PCT/US2018/046131, dated Dec. 3, 2018, 10 Pages.
International Search Report and Written Opinion for International Application No. PCT/US2018/064181, dated Mar. 29, 2019, 10 Pages.
International Search Report and Written Opinion for International Application No. PCT/US2019/014044, dated May 8, 2019, 9 Pages.
International Search Report and Written Opinion for International Application No. PCT/US2019/014904, dated Aug. 5, 2019, 7 Pages.
International Search Report and Written Opinion for International Application No. PCT/US2019/019756, dated Jun. 13, 2019, 11 Pages.
International Search Report and Written Opinion for International Application No. PCT/US2019/019765, dated Jun. 14, 2019, 9 Pages.
International Search Report and Written Opinion for International Application No. PCT/US2019/025170, dated Jul. 9, 2019, 11 Pages.
International Search Report and Written Opinion for International Application No. PCT/US2019/027727, dated Jun. 27, 2019, 10 Pages.
International Search Report and Written Opinion for International Application No. PCT/US2019/027729, dated Jun. 27, 2019, 9 Pages.
International Search Report and Written Opinion for International Application No. PCT/US2019/031521, dated Jul. 11, 2019, 8 Pages.
International Search Report and Written Opinion for International Application No. PCT/US2019/034007, dated Oct. 28, 2019, 18 Pages.
International Search Report and Written Opinion for International Application No. PCT/US2019/035724, dated Sep. 10, 2019, 11 Pages.
International Search Report and Written Opinion for International Application No. PCT/US2019/036484, dated Sep. 19, 2019, 9 Pages.

(56) References Cited

OTHER PUBLICATIONS

International Search Report and Written Opinion for International Application No. PCT/US2019/036492, dated Sep. 25, 2019, 8 Pages.
International Search Report and Written Opinion for International Application No. PCT/US2019/036536, dated Sep. 26, 2019, 13 Pages.
International Search Report and Written Opinion for International Application No. PCT/US2019/036575, dated Sep. 30, 2019, 15 Pages.
International Search Report and Written Opinion for International Application No. PCT/US2019/039410, dated Sep. 30, 2019, 10 Pages.
International Search Report and Written Opinion for International Application No. PCT/US2019/039758, dated Oct. 11, 2019, 12 Pages.
International Search Report and Written Opinion for International Application No. PCT/US2019/047156, dated Oct. 23, 2019, 9 Pages.
International Search Report and Written Opinion for International Application No. PCT/US2019/048241, dated Jan. 28, 2020, 16 Pages.
International Search Report and Written Opinion for International Application No. PCT/US2019/049756, dated Dec. 16, 2019, 8 pages.
International Search Report and Written Opinion for International Application No. PCT/US2019/059754, dated Mar. 24, 2020, 11 Pages.
International Search Report and Written Opinion for International Application No. PCT/US2019/065430, dated Mar. 6, 2020, 11 Pages.
International Search Report and Written Opinion for International Application No. PCT/US2019/066805, dated Mar. 6, 2020, 9 Pages.
International Search Report and Written Opinion for International Application No. PCT/US2019/066831, dated Feb. 27, 2020, 11 Pages.
International Search Report and Written Opinion for International Application No. PCT/US2020/044807, dated Sep. 30, 2020, 12 Pages.
International Search Report and Written Opinion for International Application No. PCT/US2020/058097, dated Feb. 12, 2021, 09 Pages.
International Search Report and Written Opinion for International Application No. PCT/US2020/059636, dated Feb. 11, 2021, 18 Pages.
International Search Report and Written Opinion for International Application No. PCT/US2021/031201, dated Aug. 2, 2021, 13 Pages.
International Search Report and Written Opinion for International Application No. PCT/US2021/033321, dated Sep. 6, 2021, 11 pages.
International Search Report and Written Opinion for International Application No. PCT/US2021/041775, dated Nov. 29, 2021, 14 pages.
International Search Report and Written Opinion for International Application No. PCT/US2021/054327, dated Feb. 14, 2022, 8 pages.
International Search Report and Written Opinion for International Application No. PCT/US2021/057966, dated Feb. 22, 2022, 15 pages.
International Search Report and Written Opinion for International Application No. PCT/US2021/065174 dated Mar. 28, 2022, 10 pages.
Kavusi S., et al., "Quantitative Study of High-Dynamic-Range Image Sensor Architecture," Proceedings of Society of Photo-Optical Instrumentation Engineers, Jun. 7, 2004, vol. 5301, 12 Pages, XP055186908.
Millet L., et al., "A 5500-Frames/s 85-GOPS/W 3-D Stacked BSI Vision Chip Based on Parallel In-Focal-Plane Acquisition and Processing," IEEE Journal of Solid-State Circuits, USA, Apr. 1, 2019, vol. 54 (4), pp. 1096-1105, XP011716786.
Non-Final Office Action dated Feb. 1, 2021 for U.S. Appl. No. 16/435,451, filed Jun. 7, 2019, 14 Pages.
Non-Final Office Action dated Jan. 1, 2021 for U.S. Appl. No. 16/715,792, filed Dec. 16, 2019, 15 Pages.
Non-Final Office Action dated May 1, 2019 for U.S. Appl. No. 15/927,896, filed Mar. 21, 2018, 10 Pages.
Non-Final Office Action dated May 1, 2020 for U.S. Appl. No. 16/384,720, filed Apr. 15, 2019, 6 Pages.
Non-Final Office Action dated Oct. 1, 2019 for U.S. Appl. No. 16/286,355, filed Feb. 26, 2019, 6 Pages.
Non-Final Office Action dated Oct. 1, 2019 for U.S. Appl. No. 16/566,583, filed Sep. 10, 2019, 10 Pages.
Non-Final Office Action dated Jul. 2, 2021 for U.S. Appl. No. 16/820,594, filed Mar. 16, 2020, 8 Pages.
Non-Final Office Action dated Mar. 2, 2022 for U.S. Appl. No. 17/127,670, filed Dec. 18, 2020, 18 pages.
Non-Final Office Action dated Sep. 2, 2021 for U.S. Appl. No. 16/910,844, filed Jun. 24, 2020, 7 Pages.
Non-Final Office Action dated Dec. 4, 2020 for U.S. Appl. No. 16/436,137, filed Jun. 10, 2019, 12 Pages.
Non-Final Office Action dated Mar. 4, 2020 for U.S. Appl. No. 16/436,049, filed Jun. 10, 2019, 9 Pages.
Non-Final Office Action dated May 7, 2021 for U.S. Appl. No. 16/421,441, filed May 23, 2019, 17 Pages.
Non-Final Office Action dated Jun. 8, 2021 for U.S. Appl. No. 17/072,840, filed Oct. 16, 2020, 7 Pages.
Non-Final Office Action dated Jul. 10, 2019 for U.S. Appl. No. 15/861,588, filed Jan. 3, 2018, 11 Pages.
Non-Final Office Action dated Jul. 10, 2020 for U.S. Appl. No. 16/255,528, filed Jan. 23, 2019, 27 Pages.
Non-Final Office Action dated Apr. 13, 2022 for U.S. Appl. No. 16/820,594, filed Mar. 16, 2020, 7 pages.
Non-Final Office Action dated May 14, 2021 for U.S. Appl. No. 16/716,050, filed Dec. 16, 2019, 16 Pages.
Non-Final Office Action dated Mar. 15, 2021 for U.S. Appl. No. 16/896,130, filed Jun. 8, 2020, 16 Pages.
Non-Final Office Action dated Sep. 18, 2019 for U.S. Appl. No. 15/876,061, filed Jan. 19, 2018, 23 Pages.
Non-Final Office Action dated Apr. 21, 2021 for U.S. Appl. No. 16/453,538, filed Jun. 26, 2019, 16 Pages.
Non-Final Office Action dated Apr. 21, 2021 for U.S. Appl. No. 17/083,920, filed Oct. 29, 2020, 17 Pages.
Non-Final Office Action dated Dec. 21, 2018 for U.S. Appl. No. 15/668,241, filed Aug. 3, 2017, 16 Pages.
Non-Final Office Action dated Oct. 21, 2021 for U.S. Appl. No. 17/083,920, filed Oct. 29, 2020, 19 Pages.
Non-Final Office Action dated Jul. 22, 2020 for U.S. Appl. No. 16/249,420, filed Jan. 16, 2019, 9 Pages.
Non-Final Office Action dated Jul. 22, 2020 for U.S. Appl. No. 16/369,763, filed Mar. 29, 2019, 15 Pages.
Non-Final Office Action dated Sep. 22, 2020 for U.S. Appl. No. 16/707,988, filed Dec. 9, 2019, 15 Pages.
Non-Final Office Action dated Nov. 23, 2018 for U.S. Appl. No. 15/847,517, filed Dec. 19, 2017, 21 Pages.
Non-Final Office Action dated Jul. 25, 2019 for U.S. Appl. No. 15/909,162, filed Mar. 1, 2018, 20 Pages.
Non-Final Office Action dated Nov. 25, 2019 for U.S. Appl. No. 15/719,345, filed Sep. 28, 2017, 14 Pages.
Non-Final Office Action dated Sep. 25, 2019 for U.S. Appl. No. 16/177,971, filed Nov. 1, 2018, 9 Pages.
Non-Final Office Action dated Apr. 27, 2021 for U.S. Appl. No. 16/829,249, filed Mar. 25, 2020, 9 Pages.
Non-Final Office Action dated Jul. 27, 2020 for U.S. Appl. No. 16/566,583, filed Sep. 10, 2019, 11 Pages.
Non-Final Office Action dated Jun. 27, 2019 for U.S. Appl. No. 15/801,216, filed Nov. 1, 2017, 13 Pages.
Non-Final Office Action dated Mar. 28, 2022 for U.S. Appl. No. 17/072,840, filed Oct. 16, 2020, 8 Pages.
Non-Final Office Action dated Aug. 29, 2019 for U.S. Appl. No. 15/983,391, filed May 18, 2018, 12 Pages.

(56) References Cited

OTHER PUBLICATIONS

Non-Final Office Action dated Jan. 30, 2020 for U.S. Appl. No. 16/431,693, filed Jun. 4, 2019, 6 Pages.
Non-Final Office Action dated Jun. 30, 2020 for U.S. Appl. No. 16/436,049, filed Jun. 10, 2019, 11 Pages.
Non-Final Office Action dated Jan. 31, 2020 for U.S. Appl. No. 16/210,748, filed Dec. 5, 2018, 11 Pages.
Notice of Allowability dated May 6, 2020 for U.S. Appl. No. 15/876,061, filed Jan. 19, 2018, 2 Pages.
Notice of Allowance dated Apr. 1, 2021 for U.S. Appl. No. 16/255,528, filed Jan. 23, 2019, 7 Pages.
Notice of Allowance dated May 1, 2019 for U.S. Appl. No. 15/847,517, filed Dec. 19, 2017, 11 Pages.
Notice of Allowance dated Mar. 2, 2022 for U.S. Appl. No. 16/453,538, filed Jun. 26, 2019, 8 pages.
Notice of Allowance dated Nov. 2, 2021 for U.S. Appl. No. 16/453,538, filed Jun. 26, 2019, 8 Pages.
Notice of Allowance dated Nov. 3, 2020 for U.S. Appl. No. 16/566,583, filed Sep. 10, 2019, 11 Pages.
Notice of Allowance dated Sep. 3, 2020 for U.S. Appl. No. 15/719,345, filed Sep. 28, 2017, 12 Pages.
Notice of Allowance dated Feb. 4, 2020 for U.S. Appl. No. 15/876,061, filed Jan. 19, 2018, 13 Pages.
Notice of Allowance dated Jun. 4, 2020 for U.S. Appl. No. 16/286,355, filed Feb. 26, 2019, 7 Pages.
Notice of Allowance dated Jul. 5, 2022 for U.S. Appl. No. 16/899,908, filed Jun. 12, 2020, 10 pages.
Notice of Allowance dated Mar. 5, 2020 for U.S. Appl. No. 15/668,241, filed Aug. 3, 2017, 8 Pages.
Notice of Allowance dated May 5, 2021 for U.S. Appl. No. 16/707,988, filed Dec. 9, 2019, 14 Pages.
Notice of Allowance dated Jan. 7, 2022 for U.S. Appl. No. 16/899,908, filed Jun. 12, 2020, 10 pages.
Notice of Allowance dated Mar. 7, 2022 for U.S. Appl. No. 16/421,441, filed May 23, 2019, 18 pages.
Notice of Allowance dated Apr. 8, 2020 for U.S. Appl. No. 15/983,391, filed May 18, 2018, 8 Pages.
Notice of Allowance dated Dec. 8, 2021 for U.S. Appl. No. 16/829,249, filed Mar. 25, 2020, 6 pages.
Notice of Allowance dated Jul. 8, 2021 for U.S. Appl. No. 17/150,925, filed Jan. 15, 2021, 10 Pages.
Notice of Allowance dated Jul. 9, 2020 for U.S. Appl. No. 16/454,787, filed Jun. 27, 2019, 9 Pages.
Notice of Allowance dated Sep. 9, 2020 for U.S. Appl. No. 16/454,787, filed Jun. 27, 2019, 9 Pages.
Notice of Allowance dated Aug. 10, 2022 for U.S. Appl. No. 16/896,130, filed Jun. 8, 2020, 8 pages.
Notice of Allowance dated Jun. 11, 2020 for U.S. Appl. No. 16/382,015, filed Apr. 11, 2019, 11 Pages.
Notice of Allowance dated Mar. 11, 2022 for U.S. Appl. No. 16/716,050, filed Dec. 16, 2019, 13 pages.
Notice of Allowance dated Aug. 12, 2020 for U.S. Appl. No. 15/719,345, filed Sep. 28, 2017, 10 Pages.
Notice of Allowance dated Feb. 12, 2020 for U.S. Appl. No. 16/286,355, filed Feb. 26, 2019, 7 Pages.
Notice of Allowance dated Jul. 13, 2021 for U.S. Appl. No. 16/896,130, filed Jun. 8, 2020, 8 Pages.
Notice of Allowance dated Feb. 14, 2022 for U.S. Appl. No. 16/715,792, filed Dec. 16, 2019, 9 pages.
Notice of Allowance dated Oct. 14, 2020 for U.S. Appl. No. 16/384,720, filed Apr. 15, 2019, 8 Pages.
Notice of Allowance dated Oct. 15, 2020 for U.S. Appl. No. 16/544,136, filed Aug. 19, 2019, 11 Pages.
Notice of Allowance dated Apr. 16, 2021 for U.S. Appl. No. 16/715,792, filed Dec. 16, 2019, 10 Pages.
Notice of Allowance dated Feb. 16, 2022 for U.S. Appl. No. 17/150,925, filed Jan. 15, 2021, 9 pages.
Notice of Allowance dated Sep. 16, 2020 for U.S. Appl. No. 16/435,449, filed Jun. 7, 2019, 7 Pages.
Notice of Allowance dated Nov. 17, 2021 for U.S. Appl. No. 16/899,908, filed Jun. 12, 2020, 7 Pages.
Notice of Allowance dated Sep. 17, 2021 for U.S. Appl. No. 16/899,908, filed Jun. 12, 2020, 11 Pages.
Notice of Allowance dated Mar. 18, 2020 for U.S. Appl. No. 15/909,162, filed Mar. 1, 2018, 9 Pages.
Notice of Allowance dated Nov. 18, 2020 for U.S. Appl. No. 16/249,420, filed Jan. 16, 2019, 8 Pages.
Notice of Allowance dated Oct. 18, 2019 for U.S. Appl. No. 15/983,379, filed May 18, 2018, 9 Pages.
Notice of Allowance dated Apr. 19, 2022 for U.S. Appl. No. 16/899,908, filed Jun. 12, 2020, 10 pages.
Notice of Allowance dated Dec. 21, 2021 for U.S. Appl. No. 16/550,851, filed Aug. 26, 2019, 10 pages.
Notice of Allowance dated Oct. 21, 2020 for U.S. Appl. No. 16/436,049, filed Jun. 10, 2019, 8 Pages.
Notice of Allowance dated Apr. 22, 2020 for U.S. Appl. No. 16/454,787, filed Jun. 27, 2019, 10 Pages.
Notice of Allowance dated Aug. 22, 2022 for U.S. Appl. No. 16/435,451, filed Jun. 7, 2019, 08 pages.
Notice of Allowance dated Dec. 22, 2021 for U.S. Appl. No. 16/910,844, filed Jun. 24, 2020, 7 pages.
Notice of Allowance dated Feb. 22, 2022 for U.S. Appl. No. 17/083,920, filed Oct. 29, 2020, 10 pages.
Notice of Allowance dated Jan. 22, 2021 for U.S. Appl. No. 16/369,763, filed Mar. 29, 2019, 8 Pages.
Notice of Allowance dated Nov. 22, 2021 for U.S. Appl. No. 16/820,594, filed Mar. 16, 2020, 18 pages.
Notice of Allowance dated Nov. 22, 2021 for U.S. Appl. No. 16/820,594, filed Mar. 16, 2020, 8 pages.
Notice of Allowance dated Sep. 22, 2022 for U.S. Appl. No. 17/150,925, filed Jan. 15, 2021, 9 pages.
Notice of Allowance dated Aug. 23, 2022 for U.S. Appl. No. 16/896,130, filed Jun. 8, 2020, 2 pages.
Notice of Allowance dated Jun. 23, 2020 for U.S. Appl. No. 15/801,216, filed Nov. 1, 2017, 5 Pages.
Notice of Allowance dated Apr. 24, 2020 for U.S. Appl. No. 16/177,971, filed Nov. 1, 2018, 6 Pages.
Notice of Allowance dated Jun. 24, 2020 for U.S. Appl. No. 16/431,693, filed Jun. 4, 2019, 7 Pages.
Notice of Allowance dated Nov. 24, 2021 for U.S. Appl. No. 16/910,844, filed Jun. 24, 2020, 8 pages.
Notice of Allowance dated Aug. 25, 2021 for U.S. Appl. No. 16/715,792, filed Dec. 16, 2019, 9 Pages.
Notice of Allowance dated Oct. 25, 2021 for U.S. Appl. No. 16/435,451, filed Jun. 7, 2019, 8 Pages.
Notice of Allowance dated Aug. 26, 2020 for U.S. Appl. No. 16/384,720, filed Apr. 15, 2019, 8 Pages.
Notice of Allowance dated Nov. 26, 2019 for U.S. Appl. No. 15/861,588, filed Jan. 3, 2018, 9 Pages.
Notice of Allowance dated Oct. 26, 2021 for U.S. Appl. No. 16/896,130, filed Jun. 8, 2020, 8 Pages.
Notice of Allowance dated Apr. 27, 2022 for U.S. Appl. No. 16/896,130, filed Jun. 8, 2020, 08 pages.
Notice of Allowance dated Jul. 27, 2020 for U.S. Appl. No. 16/435,449, filed Jun. 7, 2019, 8 Pages.
Notice of Allowance dated Apr. 28, 2022 for U.S. Appl. No. 16/435,451, filed Jun. 7, 2019, 09 pages.
Notice of Allowance dated Jun. 29, 2020 for U.S. Appl. No. 15/668,241, filed Aug. 3, 2017, 8 Pages.
Notice of Allowance dated Aug. 30, 2021 for U.S. Appl. No. 16/829,249, filed Mar. 25, 2020, 8 pages.
Notice of Allowance dated Jun. 8, 2022 for U.S. Appl. No. 17/150,925, filed Jan. 15, 2021, 10 pages.
Notice of Reason for Rejection dated Nov. 16, 2021 for Japanese Application No. 2019-571699, filed Jun. 25, 2018, 13 pages.
Notification of the First Office Action dated Oct. 28, 2021 for Chinese Application No. 2019800218483, filed Jan. 24, 2019, 17 pages.
Office Action for European Application No. 18179851.3, dated May 19, 2022, 7 pages.
Office Action dated Jul. 3, 2020 for Chinese Application No. 201810821296, filed Jul. 24, 2018, 17 Pages.

(56) References Cited

OTHER PUBLICATIONS

Office Action dated Jul. 5, 2022 for Korean Application No. 10-2020-7002533, filed Jun. 25, 2018, 13 pages.
Office Action dated Jul. 7, 2021 for European Application No. 19723902.3, filed Apr. 1, 2019, 3 Pages.
Office Action dated Jul. 7, 2021 for European Application No. 19737299.8, filed Jun. 11, 2019, 5 Pages.
Office Action dated Mar. 9, 2021 for Chinese Application No. 201810821296, filed Jul. 24, 2018, 10 Pages.
Office Action dated Jul. 12, 2022 for Japanese Application No. 2019-571699, filed Jun. 25, 2018, 5 pages.
Office Action dated Aug. 14, 2019 for European Application No. 18188968.4, filed Aug. 14, 2018, 5 Pages.
Office Action dated Dec. 14, 2021 for Japanese Application No. 2019571598, filed Jun. 26, 2018, 12 pages.
Office Action dated Mar. 15, 2022 for Japanese Patent Application No. 2020505830, filed on Aug. 9, 2018, 12 pages.
Office Action dated Mar. 17, 2022 for Taiwan Application No. 20180124384, 26 pages.
Office Action dated May 18, 2022 for Taiwan Application No. 108122878, 24 pages.
Office Action dated Jul. 19, 2022 for Japanese Application No. 2019571598, filed Jun. 26, 2018, 10 pages.
Office Action dated Nov. 26, 2019 for European Application No. 18188684.7, filed Aug. 13, 2018, 9 Pages.
Office Action dated Sep. 26, 2022 for Korean Patent Application No. 10-2020-7002496, filed on Jun. 26, 2018, 17 pages.
Office Action dated Aug. 28, 2019 for European Application No. 18188962.7, filed Aug. 14, 2018, 6 Pages.
Office Action dated Jun. 28, 2020 for Chinese Application No. 201810821296, filed Jul. 24, 2018, 2 Pages.
Office Action dated Mar. 29, 2022 for Japanese Patent Application No. 2020520431, filed on Jun. 25, 2018, 10 pages.
Office Action dated Aug. 30, 2022 for Japanese Patent Application No. 2020505830, filed on Aug. 9, 2018, 5 pages.
Office Action dated Sep. 30, 2021 for Taiwan Application No. 107124385, 17 Pages.
Partial European Search Report for European Application No. 18179838.0, dated Dec. 5, 2018, 13 Pages.
Partial International Search Report and Provisional Opinion for International Application No. PCT/US2021/041775, dated Oct. 8, 2021, 12 pages.
Restriction Requirement dated Feb. 2, 2021 for U.S. Appl. No. 16/716,050, filed Dec. 16, 2019, 7 Pages.
Sebastian A., et al., "Memory Devices and Applications for In-memory Computing," Nature Nanotechnology, Nature Publication Group, Inc, London, Mar. 30, 2020, vol. 15 (7), pp. 529-544, XP037194929.
Shi C., et al., "A 1000fps Vision Chip Based on a Dynamically Reconfigurable Hybrid Architecture Comprising a PE Array and Self-Organizing Map Neural Network," International Solid-State Circuits Conference, Session 7, Image Sensors, Feb. 10, 2014, pp. 128-130, XP055826878.
Snoeij M.F., et al., "A low Power Column-Parallel 12-bit ADC for CMOS Imagers," XP007908033, Jun. 1, 2005, pp. 169-172.
Snoeij M.F., et al., "A Low-Power Column-Parallel 12-bit ADC for CMOS Imagers," Harvestimaging [online], Proceedings IEEE Workshop on Charge-Coupled Devices and Advanced Image Sensors (CCDS & AIS), Published date: Jun. 1, 2005, pp. 169-172, XP007908033, Retrieved from the Internet: URL: http://www.harvestimaging.com/pubdocs/084_2005_june_workshop.pdf.
Supplemental Notice of Allowability dated Apr. 29, 2020 for U.S. Appl. No. 15/668,241, filed Aug. 3, 2017, 5 Pages.
Tanner S., et al., "Low-Power Digital Image Sensor for Still Picture Image Acquisition," Visual Communications and Image Processing, San Jose, Jan. 22, 2001, vol. 4306, pp. 358-365, XP008014232.
Xu C., et al., "A New Digital-Pixel Architecture for CMOS Image Sensor with Pixel-Level ADC and Pulse Width Modulation using a 0.18 um CMOS Technology," Electron Devices and Solid-State Circuits, IEEE Conference on Kowloon, Hong Kong, Piscataway, NJ, USA, Dec. 16, 2003, pp. 265-268, XP010695857.
Notice of Allowance dated Oct. 21, 2022 for U.S. Appl. No. 16/899,908, filed Jun. 12, 2020, 10 pages.
Office Action dated Sep. 29, 2022 for Taiwan Application No. 108122878, filed Jun. 28, 2019, 9 pages.
Corrected Notice of Allowability dated Jan. 9, 2023 for U.S. Appl. No. 17/150,925, filed Jan. 15, 2021, 8 pages.
Corrected Notice of Allowance dated Aug. 9, 2023 for U.S. Appl. No. 17/072,840, filed Oct. 16, 2020, 3 pages.
Final Office Action dated Dec. 2, 2022 for U.S. Appl. No. 17/072,840, filed Oct. 16, 2020, 9 pages.
International Preliminary Report on Patentability for International Application No. PCT/US2021/054327, dated Apr. 20, 2023, 7 pages.
International Preliminary Report on Patentability for International Application No. PCT/US2021/057966, dated May 19, 2023, 12 pages.
International Preliminary Reporton Patentability for International Application No. PCT/US2021/065174 dated Jul. 13, 2023, 9 pages.
Notice of Allowance dated Jun. 1, 2023 for U.S. Appl. No. 16/899,908, filed Jun. 12, 2020, 9 pages.
Notice of Allowance dated Mar. 1, 2023 for U.S. Appl. No. 17/242,152, filed Apr. 27, 2021, 9 pages.
Notice of Allowance dated Nov. 1, 2023 for U.S. Appl. No. 16/820,594, filed Mar. 16, 2020, 5 pages.
Notice of Allowance dated Oct. 2, 2023 for U.S. Appl. No. 16/435,451, filed Jun. 7, 2019, 10 pages.
Notice of Allowance dated Oct. 4, 2023 for U.S. Appl. No. 17/242,152, filed Apr. 27, 2021, 9 pages.
Notice of Allowance dated Dec. 6, 2022 for U.S. Appl. No. 16/896,130, filed Jun. 8, 2020, 8 pages.
Notice of Allowance dated Apr. 7, 2021 for U.S. Appl. No. 16/436,137, filed Jun. 10, 2019, 9 pages.
Notice of Allowance dated Dec. 7, 2023 for U.S. Appl. No. 17/496,712, filed Oct. 7, 2021, 12 pages.
Notice of Allowance dated Jul. 7, 2023 for U.S. Appl. No. 16/896,130, filed Jun. 8, 2020, 8 pages.
Notice of Allowance dated Dec. 9, 2022 for U.S. Appl. No. 16/435,451, filed Jun. 7, 2019, 8 pages.
Notice of Allowance dated Feb. 10, 2023 for U.S. Appl. No. 16/899,908, filed Jun. 12, 2020, 9 pages.
Notice of Allowance dated Apr. 13, 2023 for U.S. Appl. No. 17/072,840, filed Oct. 16, 2020, 6 pages.
Notice of Allowance dated Dec. 13, 2022 for U.S. Appl. No. 16/820,594, filed Mar. 16, 2020, 5 pages.
Notice of Allowance dated Sep. 13, 2023 for U.S. Appl. No. 16/899,908, filed Jun. 12, 2020, 9 pages.
Notice of Allowance dated Jun. 16, 2023 for U.S. Appl. No. 17/242,152, filed Apr. 27, 2021, 9 pages.
Notice of Allowance dated Mar. 17, 2023 for U.S. Appl. No. 16/896,130, filed Jun. 8, 2020, 8 pages.
Notice of Allowance dated Aug. 18, 2023 for U.S. Appl. No. 17/496,712, filed Oct. 7, 2021, 12 pages.
Notice of Allowance dated Jul. 19, 2023 for U.S. Appl. No. 16/820,594, filed Mar. 16, 2020, 5 pages.
Notice of Allowance dated Nov. 21, 2022 for U.S. Appl. No. 17/242,152, filed Apr. 27, 2021, 10pages.
Notice of Allowance dated Dec. 22, 2022 for U.S. Appl. No. 17/496,712, filed Oct. 7, 2021, 13 pages.
Notice of Allowance dated Jun. 22, 2023 for U.S. Appl. No. 16/435,451, filed Jun. 7, 2019, 10 pages.
Notice of Allowance dated Apr. 24, 2023 for U.S. Appl. No. 17/496,712, filed Oct. 7, 2021, 12 pages.
Notice of Allowance dated Oct. 26, 2023 for U.S. Appl. No. 16/896,130, filed Jun. 8, 2020, 8 pages.
Notice of Allowance dated Mar. 27, 2023 for U.S. Appl. No. 16/820,594, filed Mar. 16, 2020, 5 pages.
Notice of Allowance dated Oct. 27, 2023 for U.S. Appl. No. 17/072,840, filed Oct. 16, 2020, 10 pages.
Notice of Allowance dated Jul. 31, 2023 for U.S. Appl. No. 17/072,840, filed Oct. 16, 2020, 6 pages.

(56) References Cited

OTHER PUBLICATIONS

Office Action dated Dec. 1, 2023 for Korean Application No. 10-2021-7000855, filed Jun. 11, 2019, 5 pages.
Office Action dated Nov. 2, 2022 for Taiwan Application No. 107128759, filed Aug. 17, 2018, 16 pages.
Office Action dated Jul. 4, 2023 for Korean Application No. 10-2020-7002533, filed Jun. 25, 2018, 3 pages.
Office Action dated Dec. 1, 2022 for Korean Application No. 10-2020-7002306, filed Jun. 25, 2018, 13 pages.
Office Action dated Jun. 1, 2023 for Korean Application No. 10-2020-7002306, filed Jun. 25, 2018, 3 pages.
Office Action dated Nov. 1, 2022 for Japanese Patent Application No. 2020-520431, filed on Jun. 25, 2018, 11 pages.
Office Action dated Mar. 10, 2023 for Chinese Application No. 201880053600.0, filed Jun. 25, 2018, 10 pages.
Office Action dated Feb. 15, 2023 for Chinese Application No. 201980049477.X, filed Jun. 11, 2019, 19 pages.
Office Action dated Nov. 15, 2022 for Taiwan Application No. 108120143, filed Jun. 11, 2019, 8 pages.
Office Action dated Mar. 16, 2023 for Korean Patent Application No. 10-2020-7002496, filed on Jun. 26, 2018, 3 pages.
Office Action dated Nov. 23, 2023 for Chinese Application No. 201880053600.0, filed Jun. 25, 2018, 4 pages.
Office Action dated Jul. 4, 2023 for Japanese Application No. 2019571598, filed Jun. 26, 2018, 34 pages.
Office Action dated Jan. 5, 2023 for Chinese Application No. 201980043907.7, filed Jun. 28, 2019, 14 pages.
Office Action dated Feb. 7, 2023 for Japanese Application No. 2019-571699, filed Jun. 25, 2018, 5 pages.
Office Action dated May 9, 2023 for Japanese Patent Application No. 2020-5204312, filed on Jun. 25, 2018, 6 pages.
Office Action dated May 9, 2023 for Japanese Patent Application No. 2020-563959, filed on Nov. 12, 2020, 5 pages.

\* cited by examiner

DIGITAL IMAGE SENSOR USING A SINGLE-INPUT COMPARATOR BASED QUANTIZER

REFERENCE TO RELATED APPLICATION

This application claims priority to U.S. provisional patent application Ser. No. 63/131,563, filed Dec. 29, 2020, entitled, "DIGITAL PIXEL SENSOR USING SINGLE-INPUT COMPARATOR," which is hereby expressly incorporated by reference in its entirety.

TECHNICAL FIELD

The present disclosure relates generally to digital pixel sensors. More specifically, but not by way of limitation, this disclosure relates to a digital pixel sensor that uses a single-input comparator for quantization.

BACKGROUND

A typical image sensor includes an array of pixel cells. Each pixel cell may include a photodiode to sense light by converting photons into electric charge (e.g., electrons or holes). The electric charge generated by the array of photodiodes can then be quantized by an analog-to-digital converter (ADC) into digital values to generate a digital image. The digital image may be transmitted from the sensor to another system for use by the other system. Examples of the other system may include a viewing system for viewing the digital image, a processing system for interpreting the digital image, or a compilation system for compiling a set of digital images.

SUMMARY

One example of the present disclosure relates to an image sensing apparatus comprising a pixel cell including a photodiode configured to generate an electric charge in response to light. The image sensing apparatus also includes a quantizer circuit coupled to the pixel cell. The quantizer circuit includes a charge storage device configured to generate a voltage based on the electric charge, the charge storage device being coupled between the pixel cell and a comparator. The quantizer circuit also includes the comparator, wherein the comparator is a single-input comparator configured to switch from a first output state to a second output state in response to a ramp signal being equivalent to the voltage of the charge storage device. The quantizer circuit also includes a memory switch coupled to an output of the single-input comparator, the memory switch being configured to cause a counter value from a digital counter to be stored in a digital memory in response to the single-input comparator switching from the first output state to the second output state. The counter value can serve as a digital pixel value corresponding to the voltage. The image sensor apparatus also includes a ramp generator configured to transmit the ramp signal to a node positioned between the pixel cell and the charge storage device for switching the comparator from the first output state to the second output state.

Another example of the present disclosure relates to a method performed by an image sensor apparatus that includes a pixel cell coupled to a quantizer circuit, the quantizer circuit including a single-input comparator and a charge storage device coupled between the pixel cell and the single-input comparator. The method includes resetting the single-input comparator to a trip voltage level. The method includes generating a voltage at the charge storage device based on a difference between the trip voltage level and an electric charge output by the pixel cell. The method includes transmitting a ramp signal to a node positioned between the pixel cell and the charge storage device. The method includes switching the single-input comparator from a first output state to a second output state in response to the ramp signal being equivalent to the voltage at the charge storage device. The method includes, based on switching the single-input comparator from the first output state to the second output state, transmitting an output voltage from the single-input comparator to a memory switch. And the method includes storing a counter value from a digital counter to a digital memory in response to the memory switch receiving the output voltage from the single-input comparator, the counter value serving as a digital pixel value associated with the pixel cell.

Yet another example of the present disclosure relates to an artificial reality system that includes a display device for outputting an artificial reality environment, and an image sensor. The image sensor comprises a pixel array configured to generate a digital image, wherein the pixel array includes pixel cells with photodiodes configured to generate electric charges in response to light. The image sensor also includes a quantizer circuit coupled to the pixel array. The quantizer circuit includes a charge storage device configured to generate a voltage based on the electric charge, the charge storage device being coupled between the pixel cell and a comparator. The quantizer circuit also includes the comparator, wherein the comparator is a single-input comparator configured to switch from a first output state to a second output state in response to a ramp signal being equivalent to the voltage of the charge storage device. The quantizer circuit also includes a memory switch coupled to an output of the single-input comparator, the memory switch being configured to cause a counter value from a digital counter to be stored in a digital memory in response to the single-input comparator switching from the first output state to the second output state. The counter value can serve as a digital pixel value corresponding to the voltage. The image sensor can also include a ramp generator configured to transmit the ramp signal to a node positioned between the pixel cell and the charge storage device for switching the comparator from the first output state to the second output state. The artificial reality system further includes a host processor coupled to the image sensor and the display device, the host processor being configured to generate artificial reality content for display on the display device based on the digital image generated using the image sensor.

These illustrative examples are mentioned not to limit or define the scope of this disclosure, but rather to provide examples to aid understanding thereof. Illustrative examples are discussed in the Detailed Description, which provides further description. Advantages offered by various examples may be further understood by examining this specification.

BRIEF DESCRIPTION OF THE DRAWINGS

Illustrative embodiments are described with reference to the following figures.

Figure 1:
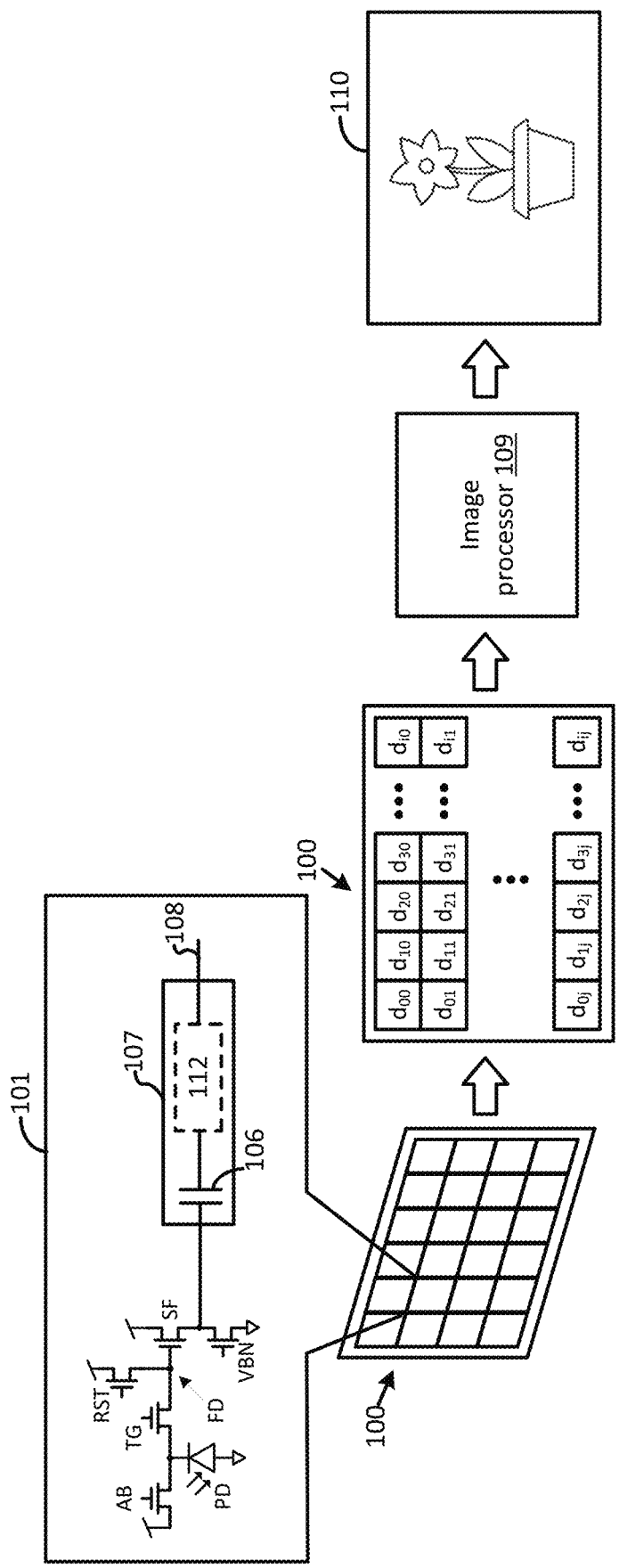
FIG. 1 illustrates an example of an image sensor and its operations according to some aspects of the present disclosure.

The figures depict some examples of the present disclosure for purposes of illustration only. One skilled in the art will readily recognize from the following description that alternative examples of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A digital image sensor ("image sensor") typically includes an array of pixel cells coupled to one or more quantizer circuits ("quantizers"). Each pixel cell includes a photodiode to sense incident light by converting photons into electric charge. The electric charge generated by the photodiode of each pixel cell is then supplied to a quantizer to convert the electric charge into digital values. The digital values are stored in a memory and used to generate a digital image. The digital image may be used in various wearable applications, such as object recognition and tracking, location tracking, augmented reality (AR), virtual reality (VR), etc.

A conventional quantizer of a digital image sensor can be a complex arrangement of components, such as a differential comparator and a series of transistors. A differential comparator is a comparator that receives two input voltages at two input pins, compares the two input voltages to one another, and switches between output states based on a difference between the two input voltages. This complex arrangement of components can have a relatively large footprint that takes up a relatively large amount of space on a substrate of the image sensor. Additionally, the differential comparator's performance can degrade as its supply voltage is reduced. The large size and performance degradation associated with conventional quantizers can be problematic in the context of digital image sensors, for which smaller physical sizes and lower supply voltages is a key goal as image sensors continue to be integrated into smaller devices.

Some examples of the present disclosure can overcome one or more of the abovementioned problems by providing a quantizer for a digital image sensor that may have a smaller footprint than a conventional quantizer and that may perform better at lower supply voltages than a conventional quantizer, thereby allowing the digital image sensor to be integrated into smaller devices than may be possible using a conventional quantizer.

As one particular example, a quantizer of the present disclosure can include a first switch, such as a transistor. The quantizer can also include a charge storage device, such as a capacitor. The first switch is positioned between a pixel cell and the charge storage device for electrically coupling and decoupling the pixel cell and the charge storage device. In the quantizer, the charge storage device is coupled to a single-input comparator. A single-input comparator is a type of integrated circuit component that has only one input pin and may have one or more output pins. As used herein, the "input pin" of a comparator refers to an integrated circuit pin configured to receive an input voltage (Vin_comp) for comparison to a reference voltage (Vref) to control an output voltage at an output pin. An input pin is different from the other types of pins on a comparator, such as a power pin (Vs), a ground pin (GND), an output pin (OUT), and control pins such as a reset pin (RST).

The single-input comparator can be reset by connecting its output pin to its input pin. When the comparator is reset, it eventually reaches a steady state called a "trip point." The input/output voltage of the comparator at the trip point is an intrinsic characteristic of the comparator that is determined by its internal circuitry (e.g., its transistors) and the supply voltage. Thus, the trip point (Vtrip) is not controlled by the input voltage on the input pin of the comparator. The trip point serves as the threshold voltage of the comparator against which the input voltage at the input pin is compared, unlike other types of comparators that may include multiple input pins for receiving multiple input voltages and comparing the input voltages to one another. Thus, the trip point serves as the reference voltage (Vref) in a single-input comparator.

The quantizer also includes a second switch operable to couple a ramp generator to the quantizer. For example, the second switch can couple the ramp generator to, and decouple the ramp generator from, a node of the quantizer located between the pixel cell and the charge storage device. When the second switch is closed, the ramp generator can supply a ramp signal to the single-input comparator. The ramp signal is an electric signal that has a linearly increasing voltage or a linearly decreasing voltage, depending on the implementation.

The quantizer can be coupled to a controller, which can operate the quantizer as follows. The controller can operate a reset switch to reset the single-input comparator to its trip point. While the comparator is operating at its trip point, the controller can close the first switch to connect the pixel cell to the charge storage device. Because the controller is operating at Vtrip, the charge storage device will charge to a voltage level that is the difference between Vtrip and the input voltage (Vin) to the quantizer circuit from the pixel cell. This voltage level can be referred to as a "differential voltage." Storing this differential voltage in the charge storage device can be referred to as "sampling" the differential voltage. The sampled differential voltage is then supplied as input to the single-input comparator for comparison to Vtrip. If the differential voltage is less than Vtrip, which will usually be the case, the comparator will remain in a first output state.

Next, the controller can open the first switch and close the second switch to connect the ramp generator to the single-input comparator. One example of the ramp generator can include a ramp voltage generator. The ramp generator supplies a ramp signal that sweeps a voltage range, causing the input voltage to the comparator to change as the ramp signal's voltage changes. When the ramp signal's voltage crosses the trip point of the comparator, the comparator's output will flip from the first output state to a second output state. Flipping from the first output state to the second output state causes the counter value of a digital counter synchronized with the ramp signal to be latched into digital memory cells. The stored counter value can serve as the digital pixel value corresponding to the electric charge output by the pixel cell. In this way, the electric charge provided by the pixel cell is converted into a digital pixel value using the quantizer.

As described above, the quantizer described herein can have a smaller footprint than a conventional quantizer because the single-input comparator can include less internal circuitry and therefore have a smaller overall footprint than the operational transconductance amplifiers (OTA) (e.g., differential comparators) used in conventional quantizers. And while the quantizer described herein includes the first and second switches to select which of the pixel cell and the ramp signal is coupled to the comparator, the space consumed by the first and second switches is relatively negligible in the quantizer's overall footprint. A voltage protection circuit can also be included in the quantizer to achieve higher input range than may be possible with conventional quantizers that rely on OTAs, which will be explained in greater detail later on. Additional inverter stages or positive feedback stages can be added for further amplification and load driving, which may allow for increased gain as compared to OTAs. Since the single-input comparator may only consume significant current near the trip point where the comparator flips, the amount of current consumed by the single-input comparator during other times can be very small, helping to save power.

The above introduction is provided merely as an example, not to limit or define the limits of the present subject matter. Various other examples are described herein and variations of such examples would be understood by one of skill in the art. Advantages offered by various examples may be further understood by examining this specification and/or by practicing one or more examples of the claimed subject matter.

FIG. 1 shows an example of an image sensor 100 according to some aspects of the present disclosure. The image sensor 100 can include an array of pixel cells, such as pixel cell 101, and can generate digital intensity data corresponding to digital pixels of an image. Each pixel cell 101 may include one or more photodiodes (PD), an anti-blooming gate (AB) that can prevent charge from the photodiode from overflowing to node FD when FD is holding a signal for ADC conversion, a transfer gate (TG) for transferring charge from PD to FD, a rest gate (RST) to reset the voltage at FD to a higher level, a source follower (SF) that may act as a unity gain buffer, and/or a bias transistor (VBN) that can provide bias current to SF. The pixel cell 101 may also include, or be coupled to, a quantizer 107. The quantizer 107 can include a charge storage device 106 coupled to other circuitry 112. In some examples, the quantizer 107 may be a pixel-level ADC that is accessible only by pixel cell 101. In other examples, the quantizer 107 may be accessible by multiple pixel cells, as described in greater detail later on.

Photodiode 102 may include, for example, a P-N diode, a P-I-N diode, or a pinned diode. Photodiode 102 can generate and accumulate charge upon receiving light within an exposure period, and the quantity of charge generated within the exposure period can be proportional to the intensity of the light. In some examples, the exposure period can be defined based on the timing of the AB signal.

The image sensor 100 can be coupled to an image processor 109 configured to perform one or more processing operations on the digital pixel values generated by the array of pixels to generate an output digital image 110. Examples of the image processing operations can include filtering, feature extraction, cropping, etc. The digital image 110 may then be transmitted to another system, such as a viewing system for viewing the digital image, a processing system for interpreting the digital image, or a compilation system for compiling a set of digital images.

Figure 2:
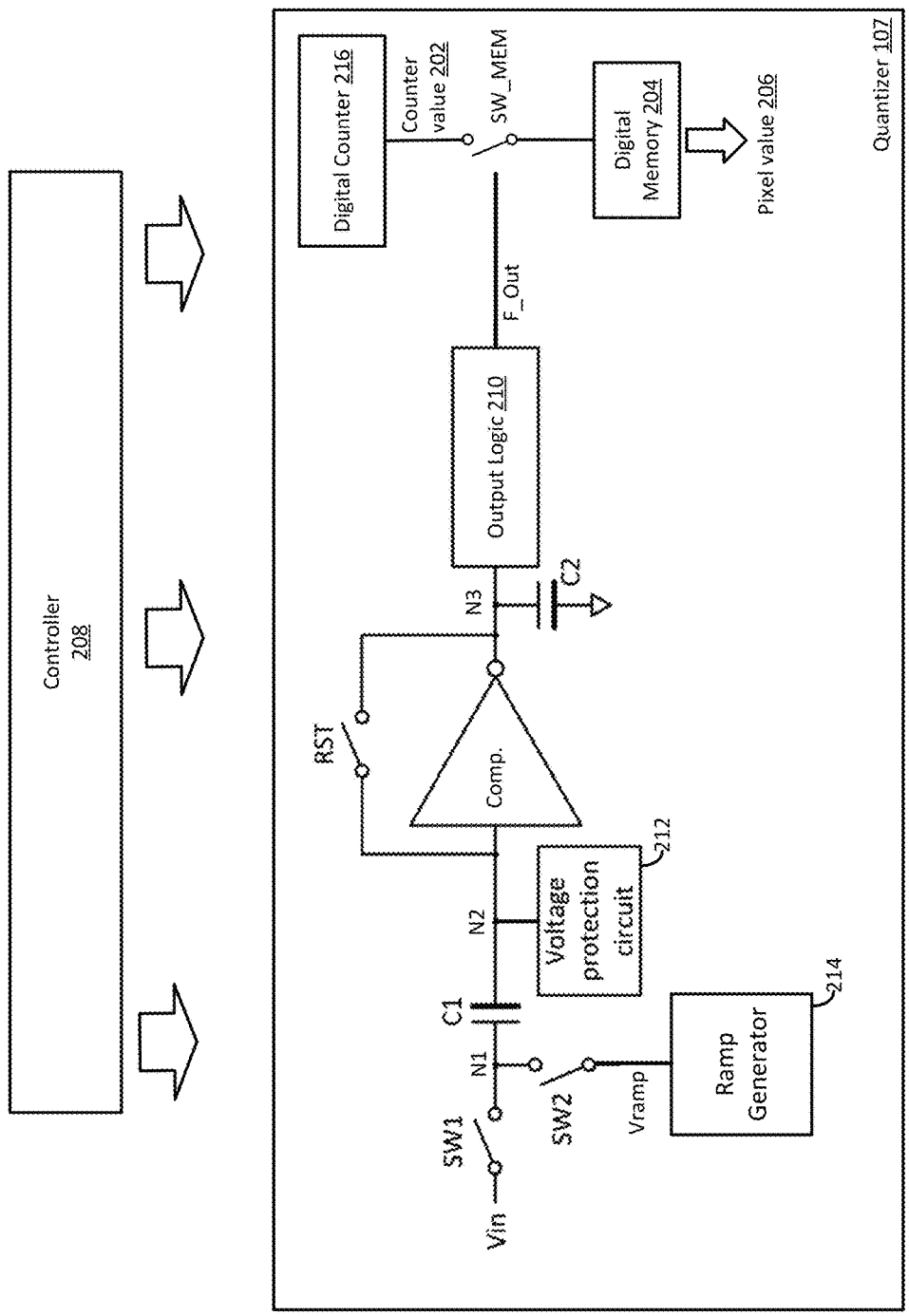
FIG. 2 illustrates an example of a quantizer and controller according to some aspects of the present disclosure.

One example of the quantizer 107 is shown in FIG. 2. As shown, the quantizer 107 includes a charge storage device (e.g., C1). An example of the charge storage device can be a capacitor. The charge storage device is coupled to a single-input comparator (Comp). Examples of the single-input comparator can include a common source amplifier and an inverter-based amplifier. A common source amplifier may consume static current (e.g., bias current) during the whole quantization period, so it may be less power efficient as compared to an inverter amplifier that may only consumes large current near the trip point.

In the example shown in FIG. 2, the quantizer 107 only has a single capacitor (C1) on the input side (i.e., the input side of the comparator). This may yield advantages over conventional quantizers that include multiple capacitors in a voltage-divider arrangement on the input side, because having multiple capacitors on the input side increases the footprint of the quantizer. Also, such voltage dividers are dependent on the ratio between the capacitors. Because different capacitor manufacturers may produce capacitors of varying quality and consistency, and because of typical capacitor tolerances, the capacitor-based voltage dividers across multiple pixel cells may be slightly different from one another, which produces gain variations that can lead to pixel uniformity issues. The quantizer 107 described herein can avoid that problem by only having a single capacitor on the input side. Of course, in other examples the quantizer 107 may also have multiple capacitors on the input side.

In the quantizer 107, a first switch (SW1) is coupled between the pixel cell and the charge storage device. The first switch is operable to couple the pixel cell to the charge storage device and decouple the pixel cell from the charge storage device based on control signals from a controller 208. A second switch (SW2) is coupled to a circuit node (N1) located between the first switch and the charge storage device. The second switch is operable to couple a ramp generator to the node and decouple the ramp generator from the node based on control signals from the controller 208. A reset switch (RST) is coupled between the output and the input of the comparator. The reset switch is operable to reset the comparator to a trip point (a trip voltage level) based on control signals from the controller 208. Examples of the switches can include transistors or relays.

In some examples, the quantizer 107 can include an output capacitor (C2) coupled between the output of the comparator and ground. The output capacitor may be a band-limiting capacitor that can reduce comparator noise. In some examples, the output capacitor can be implemented as a dedicated capacitor or as a parasitic capacitor, depending the needed capacitor size to achieve a target noise level.

In some examples, the quantizer 107 can include output logic 210 coupled to the output of the comparator to modify the digital signal output by the comparator. Examples of the output logic 210 can include an inverter or an amplifier, such as a positive feedback stage. The output logic 210 can provide for further amplification and load driving, which may allow for increased gain as compared to conventional quantizers.

In some examples, the quantizer 107 can include a voltage protection circuit 212. For example, the voltage protection circuit 212 can be coupled to a node (N2) located between the charge storage device and the single-input comparator. The voltage protection circuit 212 can limit the voltage at node N2, which is equal to the input voltage to the comparator, to a predefined voltage range. This can prevent too much voltage from being supplied to the comparator and thereby prevent the comparator from malfunctioning or breaking.

Figure 3:
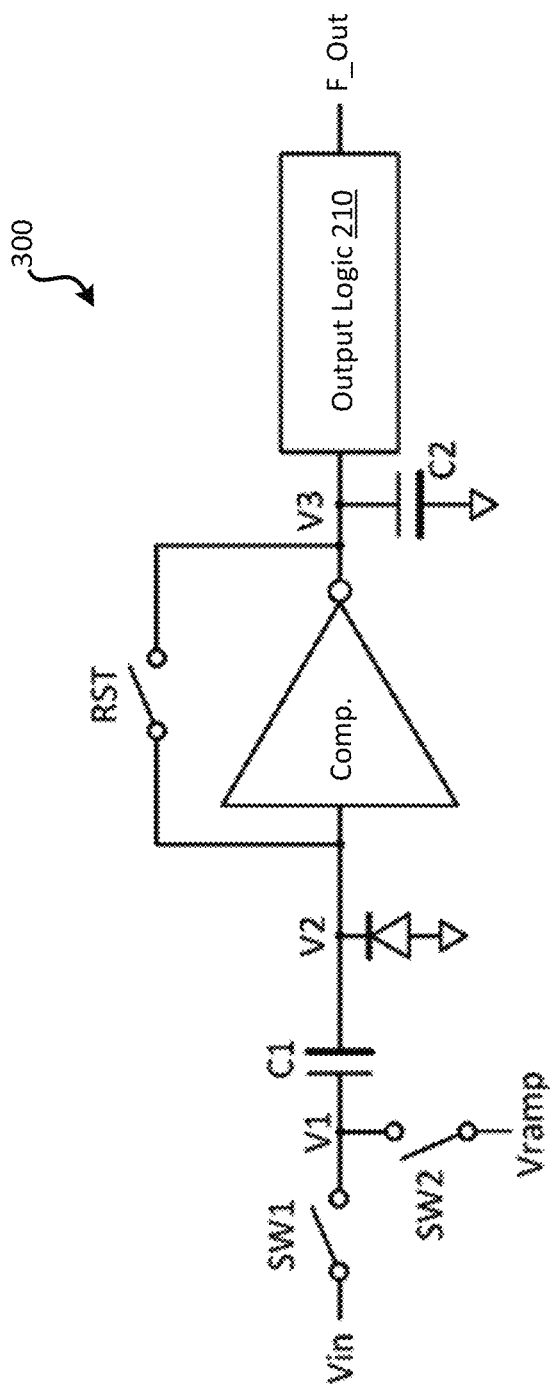
FIG. 3 illustrates an example of a quantizer with a voltage protection circuit that includes a diode according to some aspects of the present disclosure.
Figure 4:
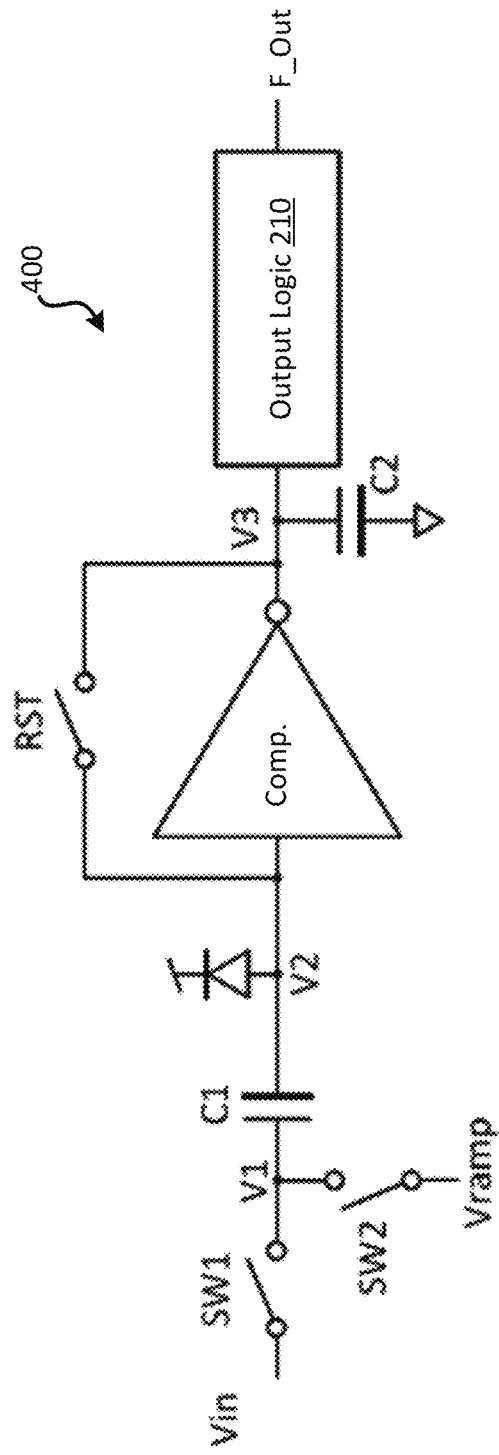
FIG. 4 illustrates another example of a quantizer with a voltage protection circuit that includes a diode according to some aspects of the present disclosure.
Figure 5:
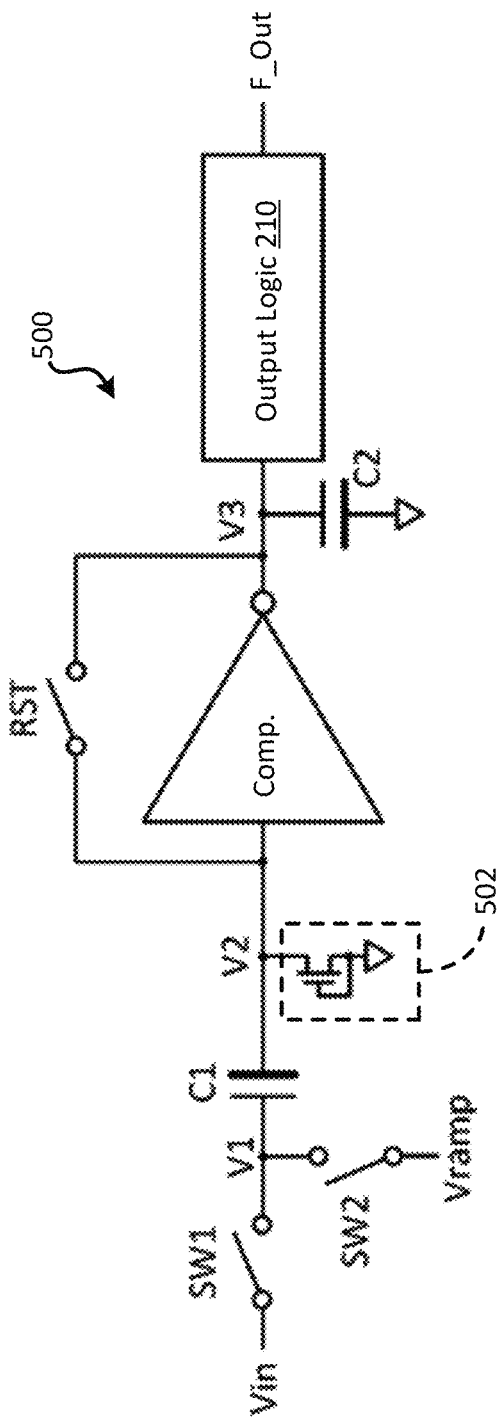
FIG. 5 illustrates an example of a quantizer with a voltage protection circuit that includes a transistor according to some aspects of the present disclosure.
Figure 6:
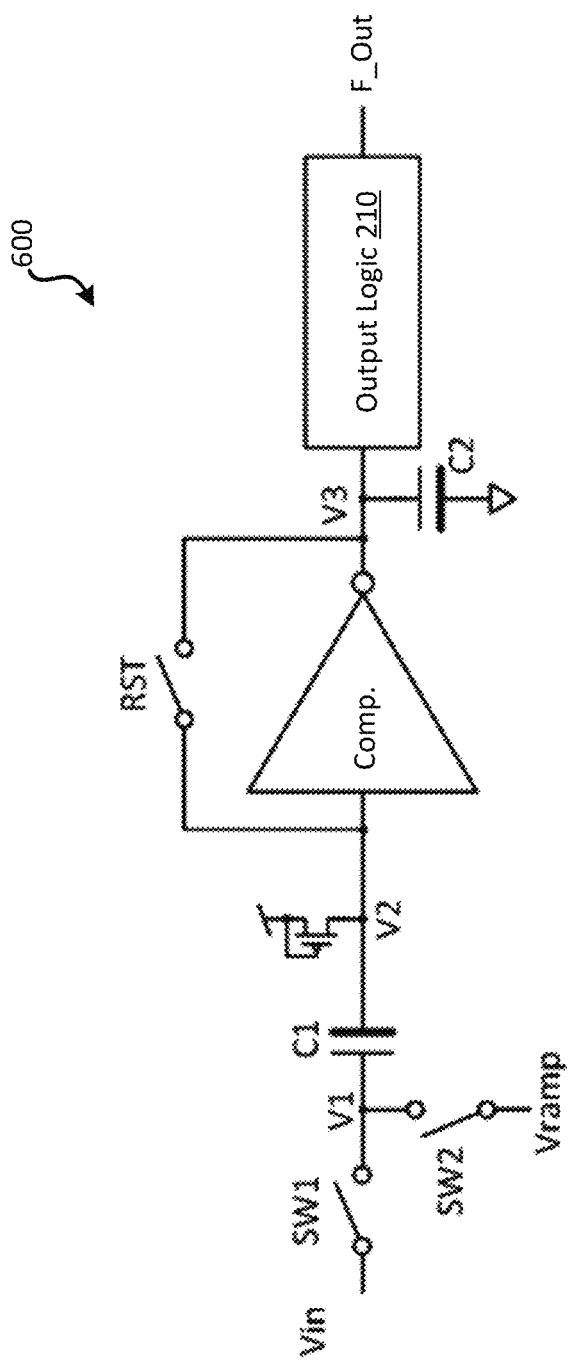
FIG. 6 illustrates another example of a quantizer with a voltage protection circuit that includes a transistor according to some aspects of the present disclosure.

Some examples of the voltage protection circuit 212 are shown in FIGS. 3-6. FIG. 3 shows an example in which the voltage protection circuit 212 includes a diode positioned between node N2 and ground. This diode configuration may be used when the ramp signal is a down ramp (linearly decreasing in voltage). In some examples, the diode can be a small antenna diode. Small antenna diodes suitable for this application may have low leakage current and low forward-bias voltage. FIG. 4 shows an example in which the voltage protection circuit 212 includes a diode positioned between node N2 and the voltage supply (e.g., Vdd). This diode configuration may be used when the ramp signal is an up ramp (linearly increasing in voltage). FIG. 5 shows an example in which the voltage protection circuit 212 includes a diode-connected transistor positioned between node N2 and ground. The transistor can be an N-MOSFET transistor with the gate coupled to the source. This transistor configuration can be used when the ramp signal is a down ramp. FIG. 6 shows an example in which the voltage protection circuit 212 includes a diode-connected transistor positioned between node N2 and the voltage supply. The transistor can be a P-MOSFET transistor with the drain coupled to the gate. This transistor configuration can be used when the ramp signal is an up ramp.

Still referring to FIG. 2, the controller 208 can operate the quantizer 107 by supplying control signals to various circuit components. To avoid overcomplicating FIG. 2, the connections between the controller 208 and various circuit components are represented by three large arrows. But it should be understood that the controller 208 is electrically coupled to at least the first switch, the second switch, and the reset switch for controlling operation thereof. The controller 208 can operate the switches in accordance with a predefined timing sequence, an example of which is shown in FIG. 7.

Figure 7:
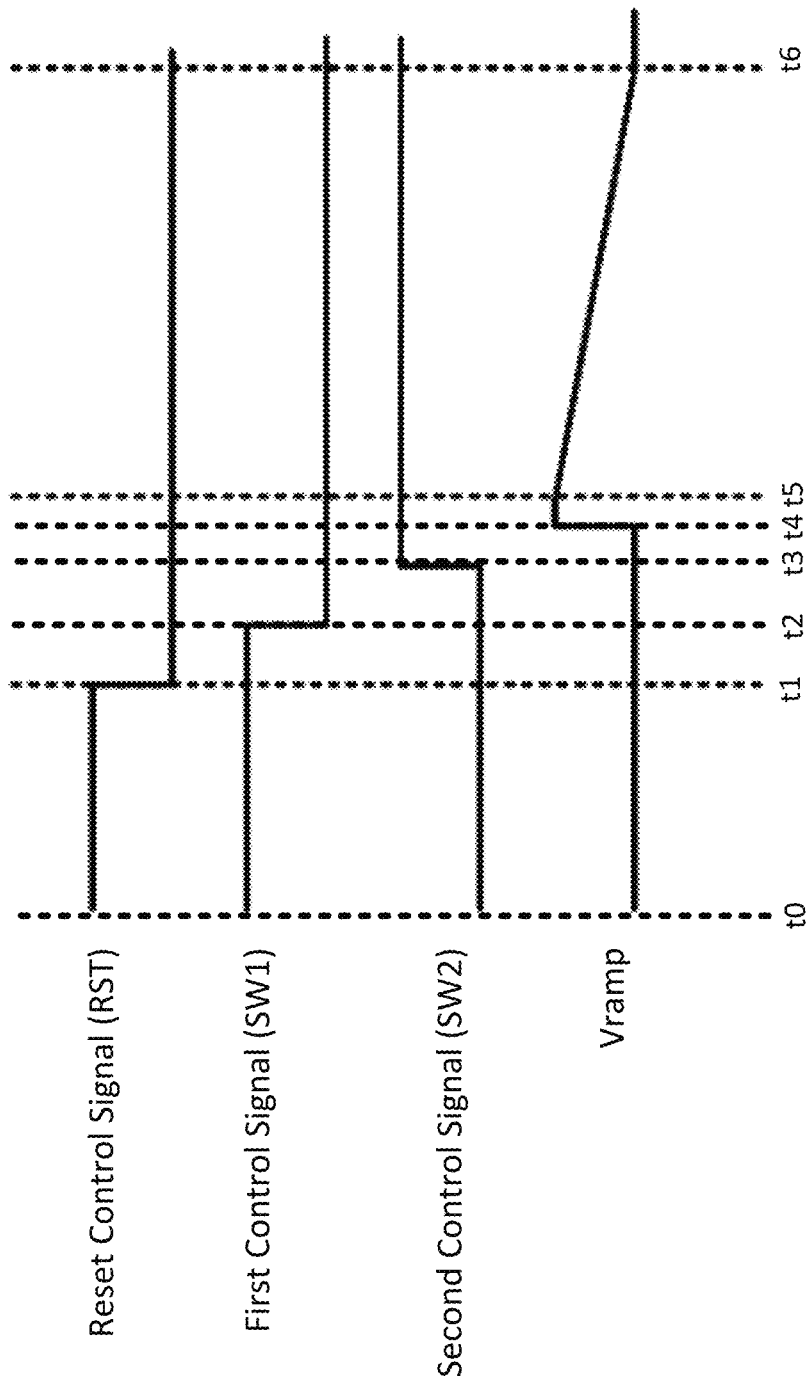
FIG. 7 illustrates an example of a timing sequence for various signals according to some aspects of the present disclosure.

As shown in FIG. 7, the controller 208 can transmit a reset control signal to operate the reset switch for resetting the comparator to its trip point. The reset control signal includes a HIGH signal (e.g., a digital 1) applied to the reset switch between times t0 and t1. The HIGH signal can close the reset switch to electrically connect the corresponding components. The reset control signal also includes a LOW signal (e.g., a digital 0) applied to the reset switch for the rest of the timing cycle. The LOW signal may cause the reset switch to open. The controller 208 can also transmit a first control signal to operate the first switch for causing electric charge to be transmitted from the pixel cell to the quantizer 107. The first control signal includes a HIGH signal applied to the first switch between times t0 and t2. The HIGH signal can close the first switch to electrically connect the corresponding components. The first control signal also includes a LOW signal applied to the first switch for the rest of the timing cycle. The LOW signal may cause the first switch to open. While the reset switch and the first switch are open, the controller 208 can transmit a second control signal to operate the second switch for causing a ramp signal (Vramp) to be transmitted from the ramp generator 214 to the quantizer 107. The second control signal includes a HIGH signal applied to the second switch from time t3 through the rest of the timing cycle. The HIGH signal can close the second switch to electrically connect the corresponding components. While the second switch is closed, the ramp signal (Vramp) can be applied to the quantizer 107. An example of the ramp signal is also shown. As shown, the ramp signal is LOW between times t0 and t4, at which point the ramp signal switches to HIGH. The ramp signal then linearly decreases between times t5-t6 back towards LOW, sweeping the voltage range from HIGH to LOW.

Referring to FIGS. 2 and 7 together, the controller 208 can operate the quantizer 107 in accordance with the following two-part process. First, the controller 208 can transmit a reset control signal to operate the reset switch and thereby reset the comparator to its trip point (Vtrip). While the comparator is operating at its trip point, the controller can transmit a first control signal to operate the first switch and thereby electrically connect the pixel cell to the charge storage device, so that the voltage at node N1 equals Vin. The voltage at node N1 can be referred to as V1. Because the controller is operating at Vtrip, the charge storage device will charge to a voltage level that is the difference between V1 and Vtrip. Thus, this process samples the differential voltage. The sampled differential voltage is then supplied as input to the single-input comparator for comparison to Vtrip. If the differential voltage is less than Vtrip, the comparator will remain in a first output state. The controller can then open the reset switch and first switch. This completes the first part of the two-part process.

Figure 15:
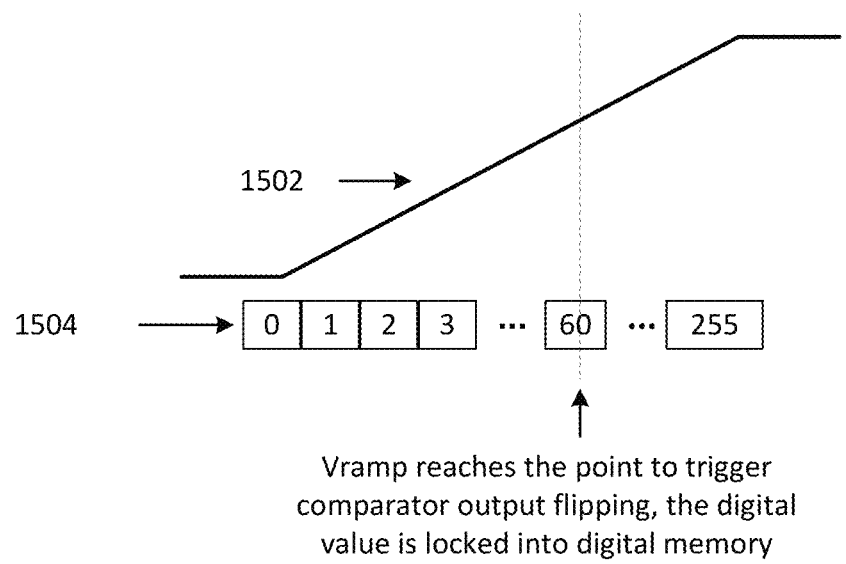
FIG. 15 illustrates an example of a process in which a digital counter value is stored in digital memory according to some aspects of the present disclosure.

Next, the controller 208 can transmit a second control signal to operate the second switch to electrically connect the ramp generator 214 to the single-input comparator. The ramp generator 214 supplies a ramp signal that sweeps a voltage range, causing the voltage at node N2 to change as the ramp signal's voltage changes. The voltage at node N2 can be referred to as V2. When V2 crosses Vtrip, the comparator's output will flip from the first output state to a second output state, causing the output voltage from the comparator to change. The output voltage from the comparator is equal to the voltage at node N3, which can be referred to as V3. Once the comparator switches output states, V3 may be HIGH or LOW, depending on the implementation. The output voltage may then be supplied to the additional output logic 210 to produce a final output signal, represented in FIG. 2 as "F_out". The final output signal can be a high-to-low or low-to-high transition signal, which can trigger a switch (SW_MEM) connecting a digital counter 216 to digital memory 204. This can cause a current counter value 202 of the digital counter 216 to be latched into digital memory 204, which can include digital memory cells. An example of this process is shown in FIG. 15, whereby the ramp signal 1502 (Vramp) and the digital counter values 1504 increase until the ramp signal 1502 triggers a flip in the comparator's output, at which point the current counter value (e.g., 60) is stored to digital memory. The stored counter value 202 can serve as a digital pixel value 206 that corresponds to the electric charge output by the pixel cell. In this way, the electric charge provided by the pixel cell is converted into a digital pixel value 206 by the quantizer 107. The digital pixel value 206 can be one pixel value in an array of pixel values that collectively form a digital image. The above process can be repeated as needed to generate pixel values for other images.

In some examples, the input range of the quantizer 107 can be derived as follows. For purposes of discussion, the following variables will be used:
Vramp_h: the maximum voltage of the ramp signal;
Vramp_l: the minimum voltage of the ramp signal;
Vin_h: the maximum voltage that can be accepted at the quantizer's input;
Vin_l: the minimum voltage that can be accepted at the quantizer's input; and
VADR: the quantizer's input range, which is generally VADR=Vin_h−Vin_l.

In some cases, ramp signal may exhibit some nonlinearity near both Vin_h and Vin_l. To avoid such a nonlinear region, the ramp signal range can be selected to exceed the input signal range with a margin on both high end and low end. For example:

$$V\text{ramp\_}h = V\text{in\_}h + VADR/8 \quad (1)$$

$$V\text{ramp\_}l = V\text{in\_}l - VADR/8 \quad (2)$$

During the reset phase in which the comparator is reset to its trip point, the voltage at node N2 (V2) will be set to Vtrip. When the first switch is turned off, Vin−Vtrip will be sampled on C1. When the second switch is turned on and node N1 is connected to Vramp, V2 can change as Vramp changes. The upper bound of V2 can be:

$$V2\_\max = V\text{ramp\_}h - (V\text{in\_}l - V\text{trip}) \quad (3)$$

$$V2\_\min = V\text{ramp\_}l - (V\text{in\_}h - V\text{trip}) \quad (4)$$

where V2_max should be less than supply voltage and V2_min should be above ground (i.e., electrical ground). As one specific example, if V2_max≤1.1 V and V2_min≥0 V are requirements for the quantizer 107, then:

$$V2\_\max - V2\_\min = V\text{ramp\_}h - V\text{ramp\_}l + V\text{in\_}h - V\text{in\_}l \quad (5)$$

After plugging equations (1) and (2) into equation (5), the result is:

$$V2\_\max - V2\_\min = 2*(V\text{in\_}h - V\text{in\_}l) + VADR/4 = 2.25*VADR \leq 1.1V \quad (6)$$

This can result in VADR≤0.49 V.

Figure 8:
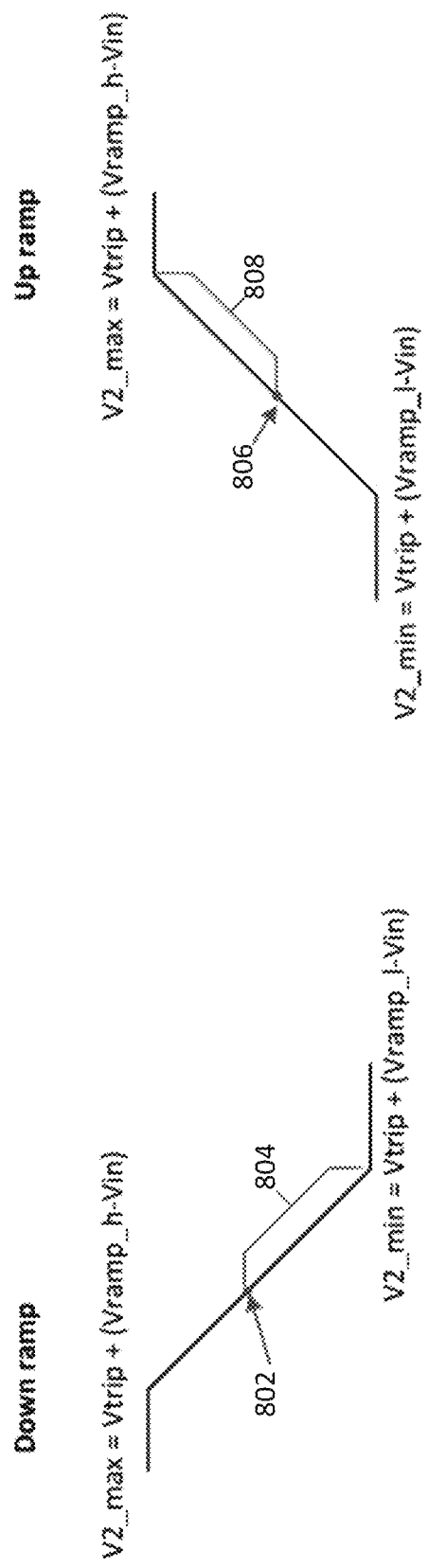
FIG. 8 illustrates an example of timings for discharging voltage using a voltage protection circuit according to some aspects of the present disclosure.

In the example above, the upper bound of VADR assumes there is no additional voltage protection circuit 212 at node N2. By including the voltage protection circuit 212, there is a discharge path when voltage exceeds a predefined limit. But because node N2 needs to stay floating to preserve the sampled differential voltage on C1 for the quantizer 107 to function properly, the added discharge path should only be engaged when the comparator finishes making its comparison, as signified by the comparator flipping between outputs states. The comparator flips between output states when V2=Vtrip or Vramp=Vin. So, when the ramp signal is a down ramp, V2 can be discharged when Vramp<Vin. When the ramp signal is an up ramp, V2 can be discharged when Vramp>Vin. This is illustrated in FIG. 8. The left side of FIG. 8 shows a down ramp signal. Point 802 is the flip point of the comparator in which Vramp=Vin. During timeframe 804, the voltage V2 can be discharged to prevent V2 from going below 0 V. The right side of FIG. 8 shows an up ramp signal. Point 806 is the flip point of the comparator in which Vramp=Vin. During timeframe 808, the voltage V2 can be discharged to prevent V2 from exceeding 1.1 V.

The timing and amount of discharging performed by the voltage protection circuit 212 can be dictated by its configuration. Referring to FIG. 5 as an example, the voltage protection circuit configuration 502 may be used with a down ramp signal. With this voltage protection circuit configuration 502, the voltage V2 will be clamped at GND−Vth, where Vth is the threshold voltage of the transistor (e.g., the N-MOSFET). In other words, V2 will be discharged when it goes below GND−Vth. If more stringent voltage protection is required, the source and gate of the transistor can be connected to a bias voltage Vb instead of ground (GND). In that configuration, the voltage V2 will be clamped at Vb−Vth. Configuring the voltage protection circuit using these techniques can help guarantee that V2 does not get discharged until after the comparator has already flipped states, which is important for the reasons described above. This is because Vtrip>0>GND−Vth. When a diode is used for the voltage protection circuit 212 (as in FIGS. 3-4) instead of a transistor, Vth can be replaced with Vd (e.g., the diode's forward bias voltage) in above calculations to arrive at similar results.

In the down ramp case, a lower Vtrip may be preferred because this leads to a larger VADR. This relationship can be explained by the equation VADR≤(VDD−Vtrip)/1.125. For example, if VDD=1.1V and Vtrip=0.3V, VADR≤0.71 V can be achieved. This is greater than VADR≤0.49 V when the voltage protection circuit 212 is not used, as described above. For similar reasons, a higher Vtrip may be preferred when an up ramp is used because this leads to a larger VADR.

Some digital image sensors may implement correlated double sampling (CDS) to reduce noise. Correlated double sampling is a method by which two samples are taken during a pixel read-out cycle. One sample is taken when the pixel is in a reset state and another sample is taken when the charge has been transferred to the read-out node. The two values are then used as differential signals in further stages, such a quantization stage. Correlated double sampling can be generally implemented in two ways. The first way involves determining a difference between the two analog signals output from the pixel and quantizing the difference. This is referred to as analog CDS, since the subtraction happens in the analog domain. The second way involves quantizing the two analog signals output from the pixel into digital values and then subtracting the digital values from one another. This is referred to as digital CDS, since the subtraction happens in the digital domain. To implement analog CDS with the quantizer 107, a capacitor divider can be provided at the input node of the comparator, as described in U.S. patent application Ser. No. 17/072,840. To implement digital CDS with the quantizer 107, the timing sequence shown in FIG. 7 can be executed twice. Thus, the quantizer 107 described herein can be used to implement either approach to correlated double sampling.

Figure 9:
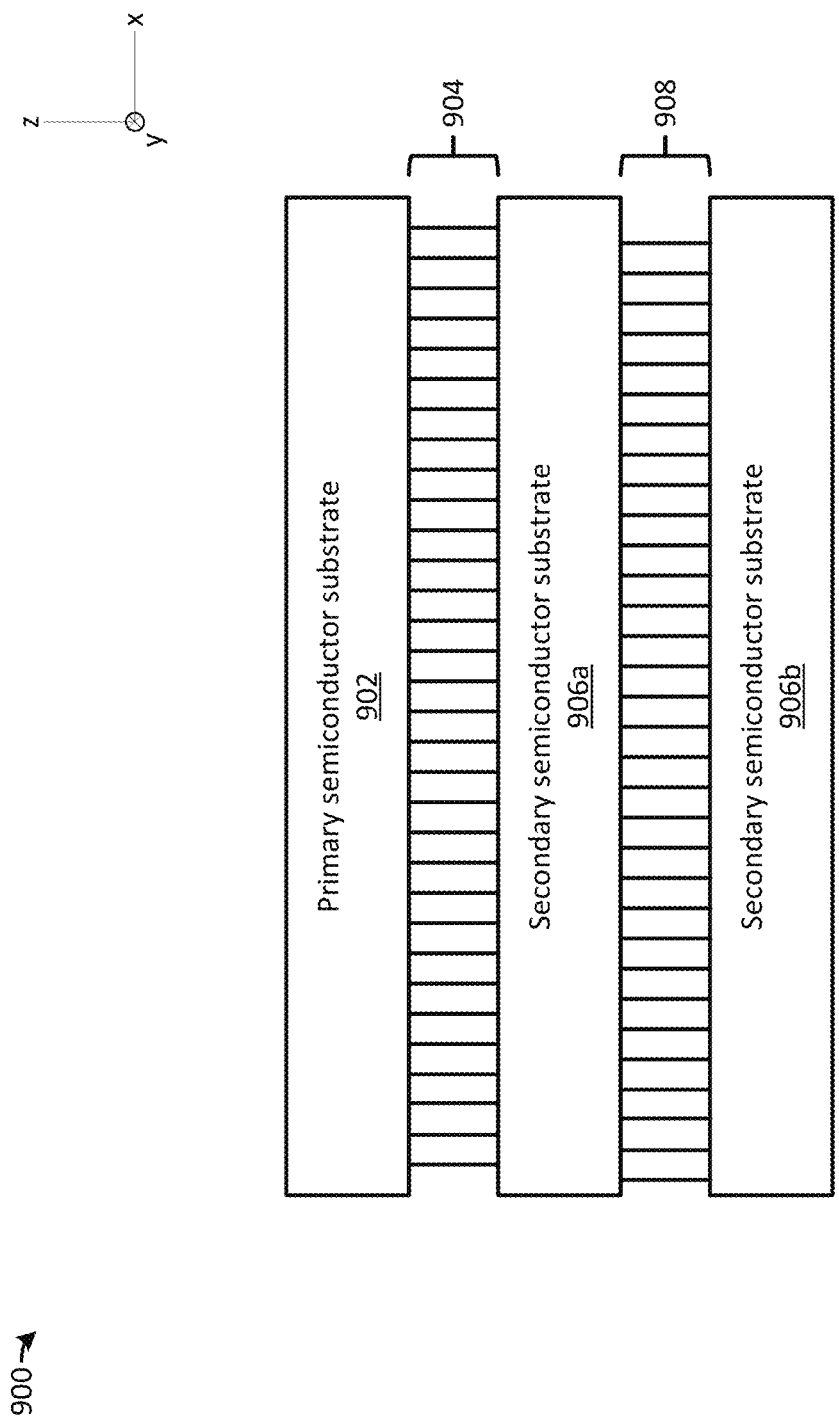
FIG. 9 illustrates an example of a stacked arrangement of substrates on which a quantizer can be disposed according to some aspects of the present disclosure.

In some examples, a digital image sensor that includes the quantizer 107 can be implemented using a stacked (e.g., layered) arrangement of substrates. One examples of this configuration is shown in FIG. 9. As shown, the image sensor 900 may include a primary semiconductor substrate 902 that includes some of the components of a pixel cell array, such as the photodiodes of the pixel cells. The image sensor 900 may also include one or more secondary semiconductor substrates 906a-b that include the processing circuits of the pixel cell array, such as a buffer, the quantizer 107, memory, and a controller (e.g., controller 208). Secondary semiconductor substrate 906a can include the processing circuits of the pixel cell array, whereas secondary semiconductor substrate 906b can include a controller.

In some examples, the primary semiconductor substrate 902 and one or more secondary semiconductor substrates 906 can form a stack along a vertical direction (e.g., represented by z-axis), with vertical interconnects 904 and 908 to provide electrical connection among the substrates. Such arrangements can reduce the routing distance of the electrical connections between the pixel cell array, the processing circuits, and the controller, which can increase the speed of transmission of data (especially pixel data) from the pixel cell array to the other components, and reduce the power required for the transmission.

Figure 10:
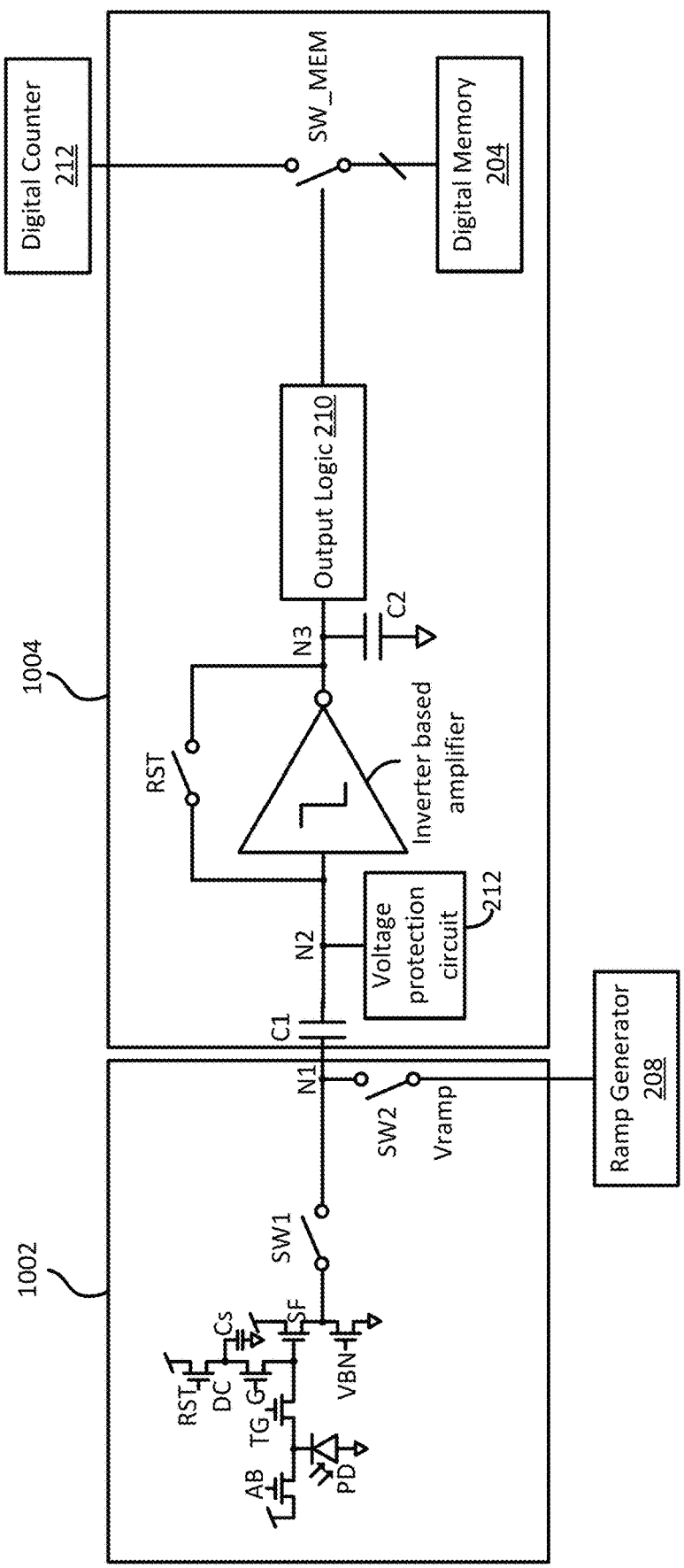
FIG. 10 illustrates an example in which the circuitry of the quantizer is disposed among multiple substrate layers arranged in a stack according to some aspects of the present disclosure.

FIG. 10 shows an example in which the circuitry of the quantizer 107 is disposed among multiple substrate layers arranged in a stack, as described above with reference to FIG. 9. Circuitry 1002 may be disposed on the primary semiconductor substrate 902 to form a first part of a pixel cell in a pixel array. Circuitry 1004 may be positioned one or more of the secondary semiconductor substrates 906a-b to form a second part of the pixel cell (e.g., the quantizer of the pixel cell). The digital counter 216 and the ramp generator 214 may be located outside the pixel array and shared among multiple pixels of the pixel array.

Figure 11:
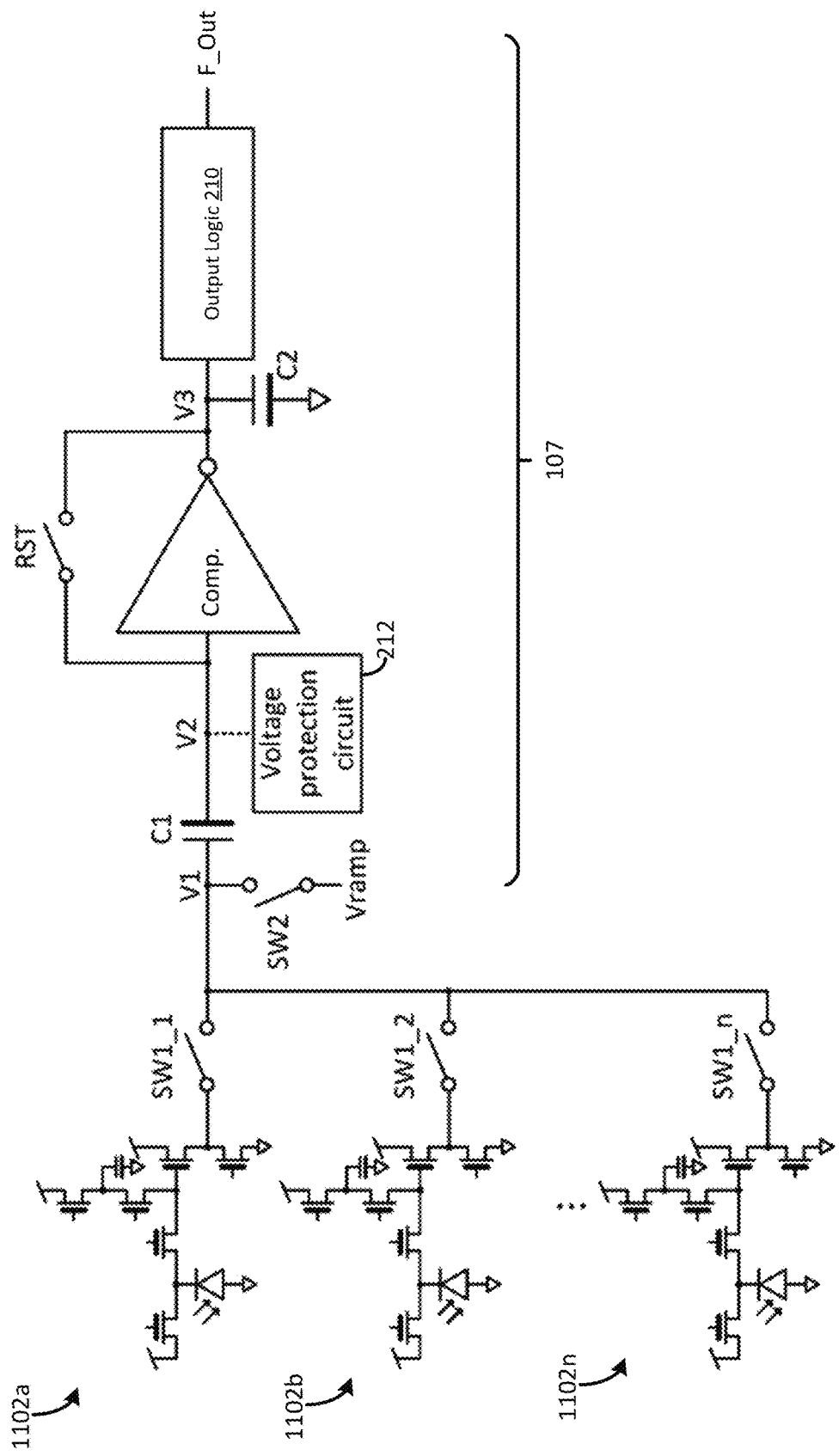
FIG. 11 illustrates an example in which a quantizer may be shared among a group of pixel cells according to some aspects of the present disclosure.

To further reduce pixel size, the quantizer 107 may be shared among a group of pixel cells in some examples. FIG. 11 shows an example of this arrangement. As shown, there is a group of pixel cells 1102a-n. The first switch (SW1) is replaced with multiple switches SW1_1, SW1_2, ... SW_n. Each of these switches connects a corresponding pixel cell to the same quantizer 107 and may be operated by a controller in the manner described above. The quantization of signals from the multiple pixel cells can be time interleaved.

Figure 12:
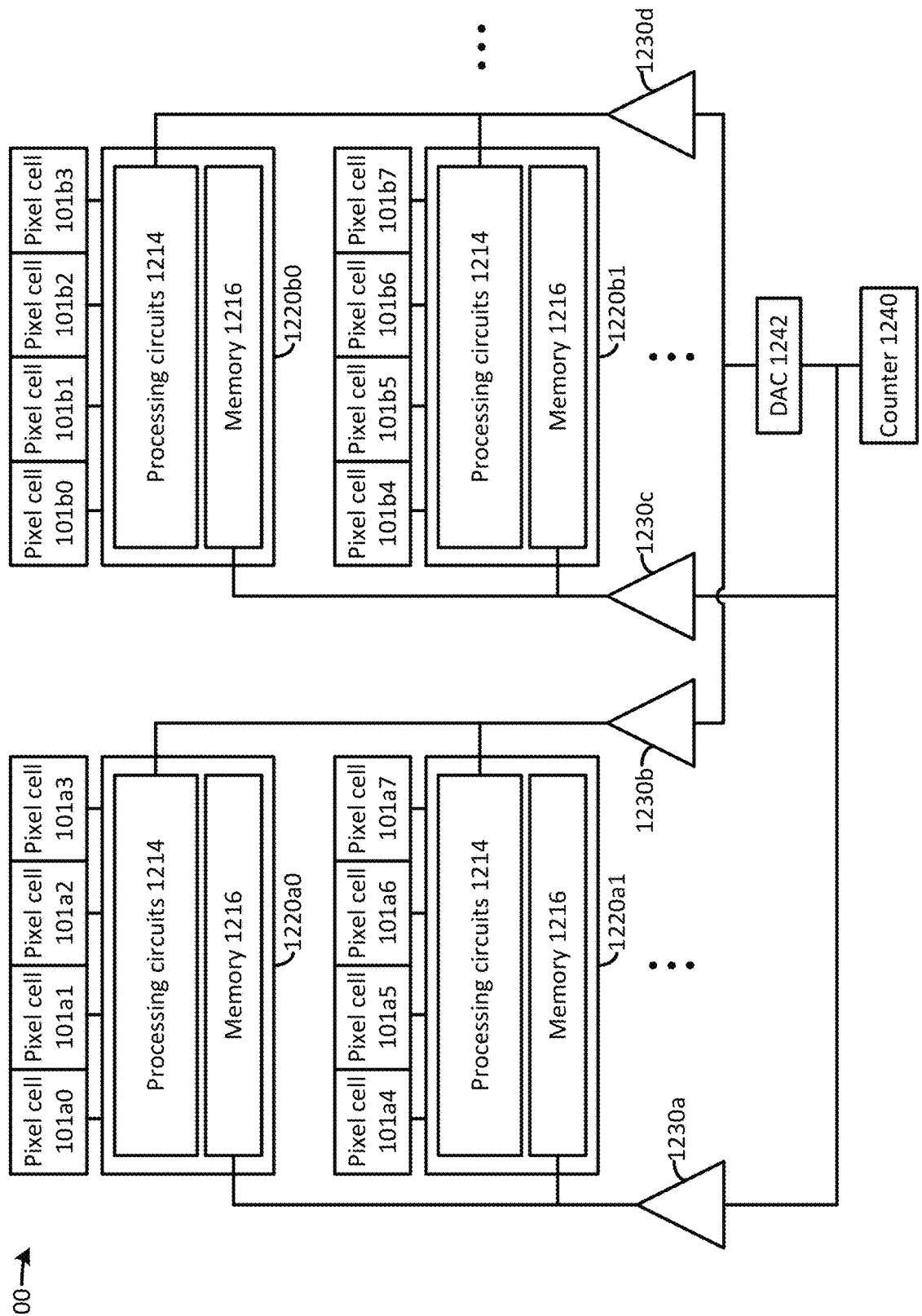
FIG. 12 illustrates an example of an image sensor according to some aspects of the present disclosure.

FIG. 12 illustrates additional components of an image sensor 100 according to some aspects of the present disclosure. As shown, image sensor 100 includes pixel cells 101 arranged in rows and columns, such as pixel cells 101a0-a3, 101a4-a7, 101b0-b3, or 101b4-b7. Each pixel cell may include one or more photodiodes. Image sensor 100 further includes quantization circuits 1220 (e.g., quantization circuits 1220a0, 1220a1, 1220b0, 1220b1), which may be similar to the quantizer 107 described above. In some examples, the quantization circuits 1220 may comprise processing circuits 1214 and memory 1216. The memory 1216 may be similar to the digital memory 204 of FIG. 2.

As shown, a block of four pixel cells may share a block-level quantization circuit 1220, which can include a block-level ADC (e.g., quantizer 107) and a block-level memory 1216, via a multiplexor. Each pixel cell can take turns accessing quantization circuit 1220 to quantize the charge. For example, pixel cells 101a0-a3 share quantization circuit 1220a0, pixel cells 101a4-a7 share quantization circuit 1221a1, pixel cells 101b0-b3 share quantization circuit 1220b0, and pixel cells 101b4-b7 share quantization circuit 1220b1. In other examples, each pixel cell may have its own dedicated quantization circuit.

Image sensor 100 further includes other circuits, such as a counter 1240 and a digital-to-analog converter (DAC) 1242. Counter 1240 may be similar to the digital counter 216. The counter 1240 can be configured as a digital ramp circuit to supply count values to memory 1216. The count values can also be supplied to DAC 1242 to generate an analog ramp, which can be supplied to quantizer 1207 to perform the quantization operation. Thus, the counter 1240 and the DAC 1242 may collectively serve as a ramp generator in some examples.

Image sensor 100 further includes a buffer network 1230 containing buffers 1230a-d. The buffers 1230a-d can distribute the digital ramp signals representing the counter values, and the analog ramp signal, to processing circuits 1214 of different blocks of pixel cells, such that at any given time each processing circuit 1214 receives the same analog ramp voltage and the same digital counter value. This my help ensure that any difference in the digital values output by different pixel cells is due to differences in the intensity of light received by the pixel cells, not due to mismatches in the digital ramp signals/counter values and analog ramp signals received by the pixel cells.

The image data from image sensor 100 can be transmitted to a host processor to support different applications, such as applications for identifying and tracking objects in images or for performing depth sensing of objects in images. Examples of the host processor can include a Field-Programmable Gate Array (FPGA), an application-specific integrated circuit (ASIC), a microprocessor, a microcontroller, or a combination of these. In some examples, the host processor can be part of an artificial reality system that can make use of the images generated by the image sensor 100. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers. The artificial reality system can include a display device, such as a liquid crystal display (LCD) or light-emitting diode (LED) display, for displaying the augmented reality content to a user.

Figure 13:
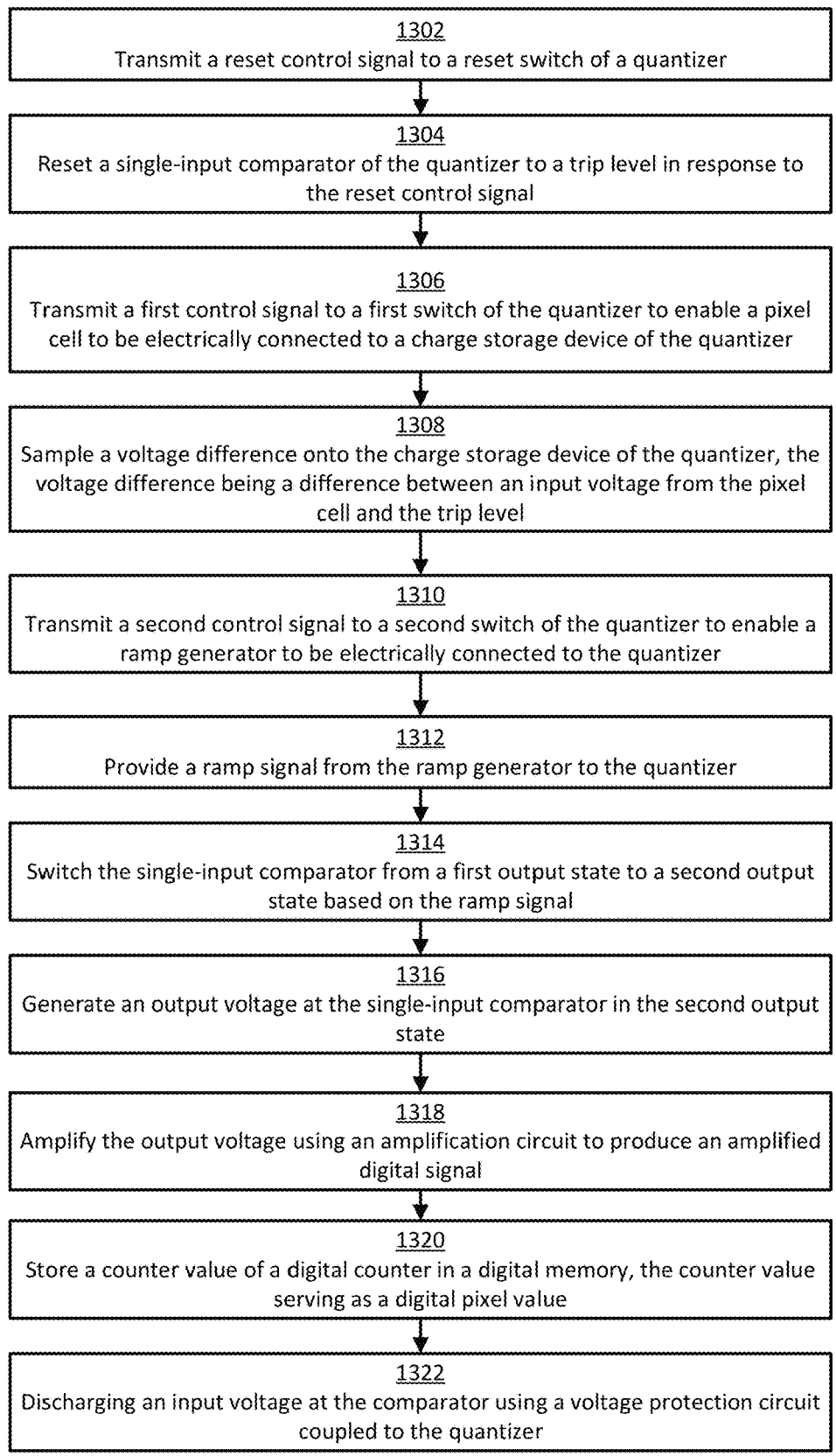
FIG. 13 illustrates an example of a process performed by an image sensor according to some aspects of the present disclosure.

FIG. 13 is a flow chart of an example of a process implemented by an image sensor 100 according to some aspects of the present disclosure. Although FIG. 13 shows a certain number and sequence of operations, other examples contemplated herein may include more operations, fewer operations, different operations, or a different order of the operations shown in FIG. 13. The steps below are discussed with reference to the components described above.

In block 1302, the image sensor 100 transmits a reset control signal to a reset switch (e.g., RST) of a quantizer 107. A controller 208 that is part of, or coupled to, the quantizer 107 can transmit the reset control signal.

In block 1304, the image sensor 100 resets a single-input comparator (e.g., Comp) of the quantizer 107 to a trip level in response to the reset control signal.

In block 1306, the image sensor 100 transmits a first control signal to a first switch (e.g., SW1) of the quantizer 107. The controller 208 can transmit the first control signal. The first control signal can enable a pixel cell to be electrically connected to a charge storage device (e.g., C1) of the quantizer 107.

In block 1308, the image sensor 100 samples a voltage difference onto the charge storage device of the quantizer 107. The voltage difference can be a difference between an input voltage (e.g., Vin) from the pixel cell and the trip level.

In block 1310, the image sensor 100 transmits a second control signal to a second switch (e.g., SW2) of the quantizer 107. The controller 208 can transmit the second control signal. The second control signal can enable a ramp generator to be electrically connected to the quantizer 107.

In block 1312, the image sensor 100 provides a ramp signal from the ramp generator to the quantizer 107.

In block 1314, the image sensor 100 switches the single-input comparator from a first output state to a second output state based on the ramp signal.

In block 1316, the image sensor 100 generates an output voltage (e.g., V3) at the single-input comparator when the comparator is in the second output state. That is, the single-input comparator can generate the output voltage when it is in the second output state. The output voltage can then be transmitted from the single-input comparator.

In block 1318, the image sensor 100 amplifies the output voltage using an amplification circuit (e.g., output logic 210) to produce an amplified digital signal. In some examples, the image sensor 100 may apply other techniques to smooth, filter, or otherwise modify the output voltage from the comparator using output logic 210.

In block 1320, the image sensor 100 stores a counter value 202 of a digital counter 216 in a digital memory 204. The counter value 202 can serve as a digital pixel value, which can represent the electric charge output by the pixel cell. The counter value 202 to be stored in the digital memory 204 in response to a memory switch (SW_MEM) changing states. The memory switch can change states based on the output voltage from the single-input comparator (e.g., the amplified digital signal).

In block 1322, the image sensor 100 discharges an input voltage (e.g., V2) at the comparator using a voltage protection circuit 212 coupled to the quantizer 107. The voltage protection circuit 212 may be part of, or electrically coupled to, the quantizer 107. Discharging the input voltage can involve dissipating at least some of the input voltage to ground.

Figure 14:
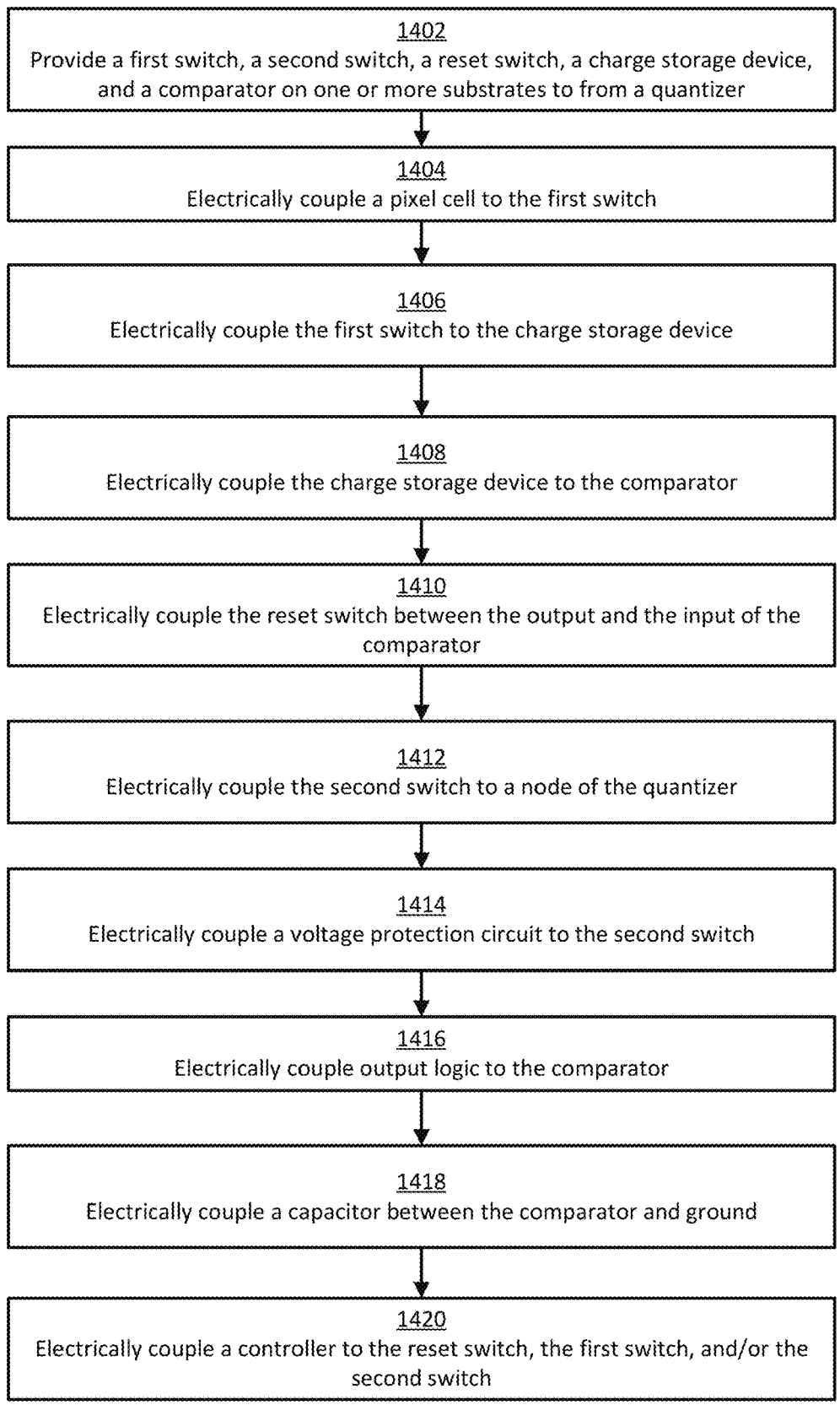
FIG. 14 illustrates an example of a process for manufacturing an image sensor apparatus according to some aspects of the present disclosure.

FIG. 14 is a flow chart of an example of a process for manufacturing an image sensor 100 according to some aspects of the present disclosure. Although FIG. 14 shows a certain number and sequence of operations, other examples contemplated herein may include more operations, fewer operations, different operations, or a different order of the operations shown in FIG. 14. The steps below are discussed with reference to the components of described above.

In block 1402, a manufacturer provides a first switch (e.g., SW1), a second switch (e.g., SW2), a reset switch (e.g., RST), a charge storage device (e.g., C1), and/or a comparator (e.g., Comp) on one or more substrates for use in a quantizer 107 of the image sensor 100. This may involve attaching some or all of these components to the one or more substrates and/or fabricating some or all of these components on the one or more substrates through various manufacturing processes. The one or more substrates may be part of a printed circuit board.

In block 1404, the manufacturer electrically couples a pixel cell of the image sensor 100 to the first switch. Electrically coupling two components together may involve electrically connecting the two components together with wires or traces. The traces may be printed traces formed from copper or another conductive material.

In block 1406, the manufacturer electrically couples the first switch to the charge storage device. The manufacturer can couple these two components together such that the first switch is positioned between the pixel cell and the charge storage device. For example, if the first switch has two leads, one lead may be electrically coupled to the pixel cell and the other lead may be electrically coupled to the charge storage device. This configuration may allow the first switch to transmit voltage from the pixel cell to the charge storage device when the first switch is in a closed state, and may prevent the first switch from transmitting voltage from the pixel cell to the charge storage device when the first switch is in an open state.

In block 1408, the manufacturer electrically couples the charge storage device to the comparator. For example, the manufacturer can electrically couple the charge storage device to the input pin of the comparator. The manufacturer can couple these two components together such that the charge storage device is positioned between the first switch and the comparator. For example, if the charge storage device has two leads, one lead may be electrically coupled to the first switch and the other lead may be electrically coupled to the comparator.

In block 1410, the manufacturer electrically couples the reset switch between the output and the input of the comparator. For example, if the reset switch has two leads, one lead may be electrically coupled to the output pin of the comparator and the other lead may be electrically coupled to the input pin of the comparator. This configuration may allow the reset switch to transmit voltage from the comparator's output to the comparator's input when the reset switch is in a closed state, causing the comparator to reset to a trip state.

In block 1412, the manufacturer can electrically couple second switch to a node (e.g., N2) of the quantizer 107. The node may be positioned between the charge storage device and the comparator.

In block 1414, the manufacturer electrically couples a voltage protection circuit to the second switch. For example, if the second switch has two leads, one lead may be electrically coupled to the node and the other lead may be electrically coupled to the voltage protection circuit. This configuration may allow the second switch to transmit voltage between the node and the voltage protection circuit when the second switch is in a closed state, and may prevent the second switch from transmitting voltage from the node to the voltage protection circuit when the second switch is in an open state. The other side of the voltage protection circuit can be electrically coupled to ground or a power supply, depending on the implementation.

In block 1416, the manufacturer electrically couples output logic 210 to the comparator. For example, the manufacturer can electrically couple the output logic 210 to the output pin of the comparator, so that output logic 210 operates on an output voltage at the output pin of the comparator.

In block 1418, the manufacturer electrically couples a capacitor (e.g., C2) between the comparator and ground. For example, the manufacturer can electrically couple the capacitor between the output pin of the comparator and ground.

In block 1420, the manufacturer electrically couples a controller 208 of the image sensor 100 to the reset switch, the first switch, and/or the second switch.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may include a general-purpose computing device selectively activated or reconfigured by a computer program stored in the computer. Such a computer program may be stored in a non-transitory, tangible computer-readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may include information resulting from a computing process, where the information is stored on a non-transitory, tangible computer-readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

The invention claimed is:

1. An image sensor apparatus, comprising:
a pixel cell including a photodiode configured to generate an electric charge in response to light;
a quantizer circuit coupled to the pixel cell, the quantizer circuit including:
a charge storage device configured to generate a voltage based on the electric charge, the charge storage device being coupled between the pixel cell and a comparator;
the comparator, wherein the comparator is a single-input comparator configured to switch from a first output state to a second output state in response to a ramp signal being equivalent to the voltage of the charge storage device, wherein the single-input comparator has a trip point that is an intrinsic characteristic of the comparator that is determined by the comparator's internal circuitry and supply voltage, the comparator being configured to use the trip point as a reference voltage for comparison to an input voltage on an only input pin of the comparator; and
a memory switch coupled to an output of the single-input comparator, the memory switch being configured to cause a counter value from a digital counter to be stored in a digital memory in response to the single-input comparator switching from the first output state to the second output state, the counter value serving as a digital pixel value corresponding to the voltage; and
a ramp generator configured to transmit the ramp signal to a node positioned between the pixel cell and the charge storage device for switching the comparator from the first output state to the second output state.

2. The image sensor apparatus of claim 1, further comprising a first switch coupled between the pixel cell and the charge storage device.

3. The image sensor apparatus of claim 2, further comprising a second switch coupled between the ramp generator and the node.

4. The image sensor apparatus of claim 3, a controller configured to transmit control signals to the first switch and the second switch to operate the quantizer circuit, the control signals being configured to switch the first switch and the second switch between open and closed states.

5. The image sensor apparatus of claim 4, further comprising a reset switch coupled across an input terminal of the comparator and an output terminal of the comparator.

6. The image sensor apparatus of claim 5, wherein the controller is configured to transmit a control signal to the reset switch to reset the comparator to a trip voltage level.

7. The image sensor apparatus of claim 1, further comprising a voltage protection circuit coupled to another node positioned between the charge storage device and the comparator, wherein the voltage protection circuit is configured to discharge an input voltage at the comparator in response to the voltage of the charge storage device exceeding a threshold limit.

8. The image sensor apparatus of claim 7, wherein the voltage protection circuit includes a diode coupled to ground or a transistor coupled to ground.

9. The image sensor apparatus of claim 7, wherein the voltage protection circuit includes a diode coupled to a power supply or a transistor coupled to the power supply.

10. The image sensor apparatus of claim 1, wherein the charge storage device includes a capacitor.

11. The image sensor apparatus of claim 1, wherein the comparator is configured to generate an output voltage in the second output state, and further comprising an amplification circuit coupled to an output terminal of the comparator for amplifying the output voltage from the comparator to produce an amplified digital signal for transmission to the memory switch.

12. The image sensor apparatus of claim 1, wherein the pixel cell is one of a plurality of pixel cells included in the image sensor apparatus, and wherein the image sensor apparatus is configured to operate a plurality of switches coupled between (i) the plurality of pixel cells and (ii) the quantization circuit in accordance with a time interleaving technique to change which pixel cell of the plurality of pixels cells is coupled to the quantizer circuit at different instants in time.

13. A method performed by an image sensor apparatus that includes a pixel cell coupled to a quantizer circuit, the quantizer circuit including a single-input comparator and a charge storage device coupled between the pixel cell and the single-input comparator, the method comprising:
resetting the single-input comparator to a trip voltage level, wherein the trip voltage level is an intrinsic characteristic of the single-input comparator that is determined by the comparator's internal circuitry and supply voltage, the single-input comparator being configured to use the trip point as a reference voltage for comparison to an input voltage on an only input pin of the single-input comparator;
generating a voltage at the charge storage device based on a difference between the trip voltage level and an electric charge output by the pixel cell;
transmitting a ramp signal to a node positioned between the pixel cell and the charge storage device;
switching the single-input comparator from a first output state to a second output state in response to the ramp signal being equivalent to the voltage at the charge storage device;
based on switching the single-input comparator from the first output state to the second output state, transmitting an output voltage from the single-input comparator to a memory switch; and
storing a counter value from a digital counter to a digital memory in response to the memory switch receiving the output voltage from the single-input comparator, the counter value serving as a digital pixel value associated with the pixel cell.

14. The method of claim 13, further comprising:
transmitting, by a controller, a control signal to a switch coupled between the pixel cell and the charge storage device for causing the switch to enable electric charge generated by a photodiode of the pixel cell to be transmitted to the charge storage device.

15. The method of claim 13, further comprising:
transmitting, by a controller, a control signal to a switch coupled between a ramp generator and the node for causing the switch to enable the ramp signal generated by the ramp generator to be transmitted to the single-input comparator.

16. The method of claim 13, further comprising:
transmitting, by a controller, a reset control signal to a reset switch coupled across an input terminal of the single-input comparator and an output terminal of the single-input comparator to reset the single-input comparator to the trip voltage level.

17. The method of claim 13, further comprising:
discharging, by a voltage protection circuit coupled to another node positioned between the charge storage device and the single-input comparator, an input voltage at the single-input comparator in response to the voltage of the charge storage device exceeding a threshold limit.

18. The method of claim 17, wherein the charge storage device includes a capacitor, and wherein the voltage protection circuit includes a diode or a transistor.

19. The method of claim 13, further comprising:
amplifying, by an amplification circuit coupled to an output terminal of the single-input comparator, the output voltage from the single-input comparator to produce an amplified digital signal for transmission to the memory switch.

20. An artificial reality system, comprising:
a display device for outputting an artificial reality environment;
an image sensor including:
a pixel array configured to generate a digital image, the pixel array including pixel cells with photodiodes configured to generate electric charges in response to light;
a quantizer circuit coupled to the pixel array, the quantizer circuit including:
a charge storage device configured to generate a voltage based on an electric charge from a pixel cell of the pixel array, the charge storage device being coupled between the pixel cell and a comparator;
the comparator, wherein the comparator is a single-input comparator configured to switch from a first output state to a second output state in response to a ramp signal being equivalent to the voltage of the charge storage device, wherein the single-input comparator has a trip point that is an intrinsic characteristic of the comparator that is determined by the comparator's internal circuitry and supply voltage, the comparator being configured to use the trip point as a reference voltage for comparison to an input voltage on an only input pin of the comparator; and
a memory switch coupled to an output of the single-input comparator, the memory switch being configured to cause a counter value from a digital counter to be stored in a digital memory in response to the single-input comparator switching from the first output state to the second output state, the counter value serving as a digital pixel value corresponding to the voltage; and
a ramp generator configured to transmit the ramp signal to a node positioned between the pixel cell and the charge storage device for switching the comparator from the first output state to the second output state; and
a host processor coupled to the image sensor and the display device, the host processor being configured to generate the artificial reality environment for display on the display device based on the digital image generated using the image sensor.

\* \* \* \* \*